(12) United States Patent
Saito

(10) Patent No.: US 8,344,435 B2
(45) Date of Patent: Jan. 1, 2013

(54) SEMICONDUCTOR MEMORY DEVICE

(75) Inventor: Toshihiko Saito, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 455 days.

(21) Appl. No.: 12/559,086

(22) Filed: Sep. 14, 2009

(65) Prior Publication Data
US 2010/0078700 A1    Apr. 1, 2010

(30) Foreign Application Priority Data
Sep. 30, 2008 (JP) ................................. 2008-252326

(51) Int. Cl.
*H01L 27/108* (2006.01)

(52) U.S. Cl. ............... 257/296; 257/298; 257/E21.008; 438/238; 438/239

(58) Field of Classification Search .......... 257/296–298, 257/308, 366, E21.008; 365/145, 148; 438/238, 438/239
See application file for complete search history.

(56) References Cited

U.S. PATENT DOCUMENTS

| | | | | |
|---|---|---|---|---|
| 5,315,141 | A * | 5/1994 | Kim | 257/308 |
| 6,051,851 | A | 4/2000 | Ohmi et al. | |
| 7,130,234 | B2 | 10/2006 | Shionoiri et al. | |
| 7,319,633 | B2 | 1/2008 | Shionoiri et al. | |
| 7,430,146 | B2 | 9/2008 | Shionoiri et al. | |
| 2003/0117389 | A1* | 6/2003 | Edwards et al. | 345/211 |
| 2003/0198077 | A1* | 10/2003 | Ueda et al. | 365/145 |
| 2005/0156829 | A1* | 7/2005 | Choi et al. | 345/76 |
| 2006/0267141 | A1 | 11/2006 | Saito | |
| 2006/0273182 | A1 | 12/2006 | Iwata | |
| 2006/0273183 | A1* | 12/2006 | Cavanagh et al. | 236/44 C |
| 2007/0171693 | A1 | 7/2007 | Koyama | |
| 2008/0002454 | A1 | 1/2008 | Inoue et al. | |
| 2008/0083830 | A1 | 4/2008 | Tokunaga et al. | |
| 2008/0083954 | A1* | 4/2008 | Tokunaga | 257/366 |
| 2008/0101108 | A1* | 5/2008 | Tokunaga et al. | 365/148 |
| 2008/0144374 | A1 | 6/2008 | Kato | |

(Continued)

FOREIGN PATENT DOCUMENTS

| | | |
|---|---|---|
| JP | 2-23653 | 1/1990 |
| JP | 10-178098 | 6/1998 |
| JP | 10-341000 | 12/1998 |
| WO | WO 2008/050880 A1 | 5/2008 |

OTHER PUBLICATIONS

International Search Report re application No. PCT/JP2009/065976, dated Dec. 15, 2009.
Written Opinion re application No. PCT/JP2009/065976, dated Dec. 15, 2009.

*Primary Examiner* — Jerome Jackson, Jr.
*Assistant Examiner* — Fang-Xing Jiang
(74) *Attorney, Agent, or Firm* — Husch Blackwell LLP

(57) ABSTRACT

To realize a semiconductor memory device whose capacitance value per unit area in a memory cell is increased without increase in the area of the memory cell. The memory cell includes a transistor, a memory element, a first capacitor, and a second capacitor. The first capacitor includes a semiconductor film, a gate insulating film, and a gate electrode which are included in the transistor and is formed at the same time as the transistor. The second capacitor includes an electrode which is included in the memory element and an insulating film and an electrode which are formed over the electrode. Further, the second capacitor is formed over the first capacitor. In this manner, the first capacitor and the second capacitor which are connected in parallel with the memory element are formed.

16 Claims, 19 Drawing Sheets

U.S. PATENT DOCUMENTS

| | | |
|---|---|---|
| 2008/0203454 A1 | 8/2008 | Asami |
| 2008/0224140 A1 | 9/2008 | Tokunaga et al. |
| 2008/0225190 A1 | 9/2008 | Chen et al. |
| 2009/0065838 A1* | 3/2009 | Nagao .......................... 257/298 |

* cited by examiner

600

600

600

600

600

600

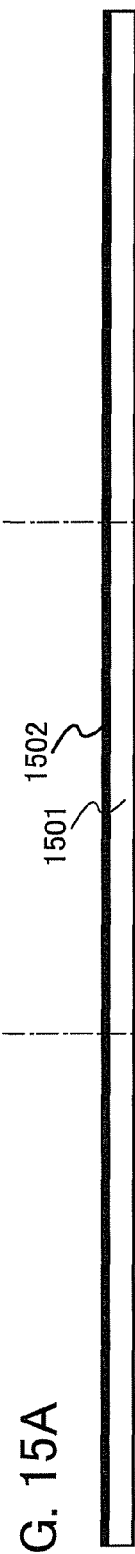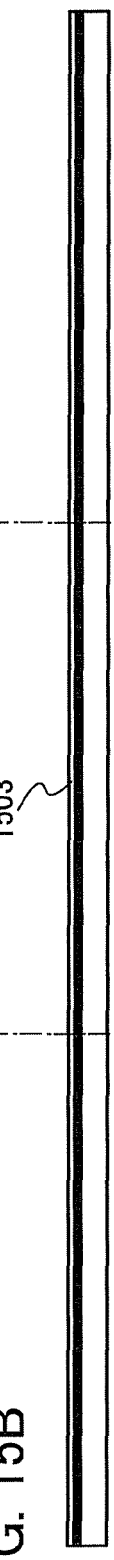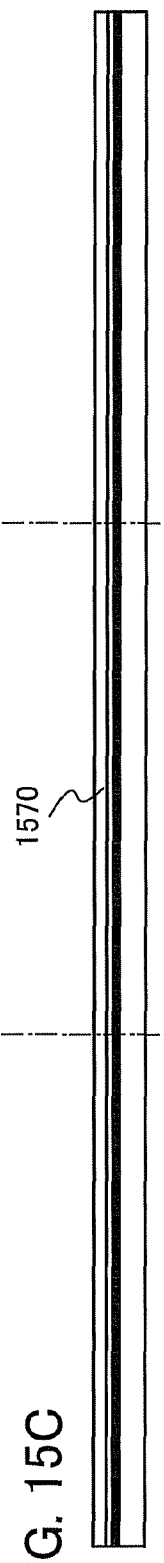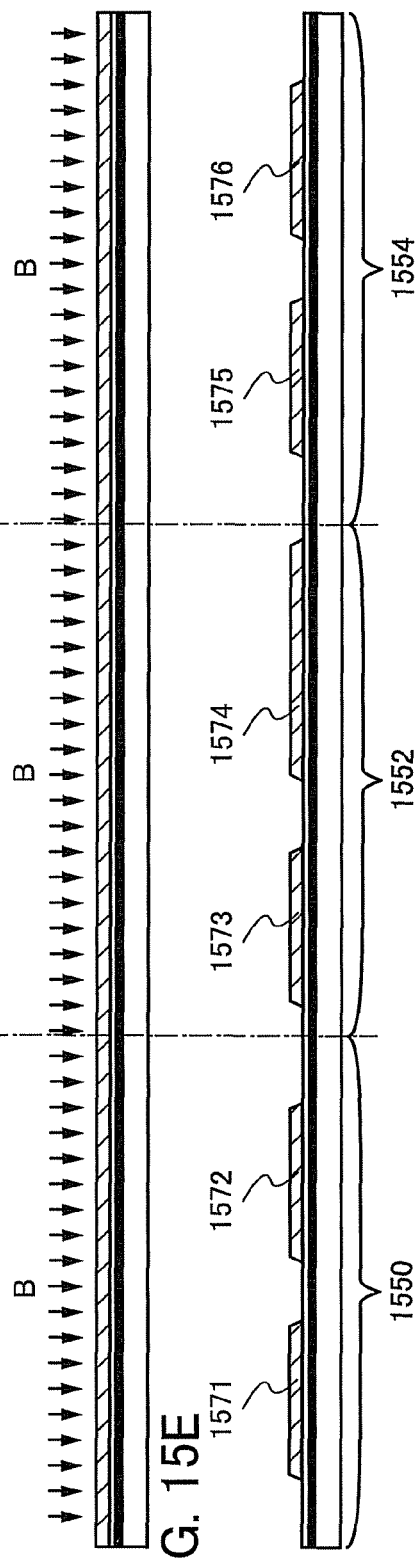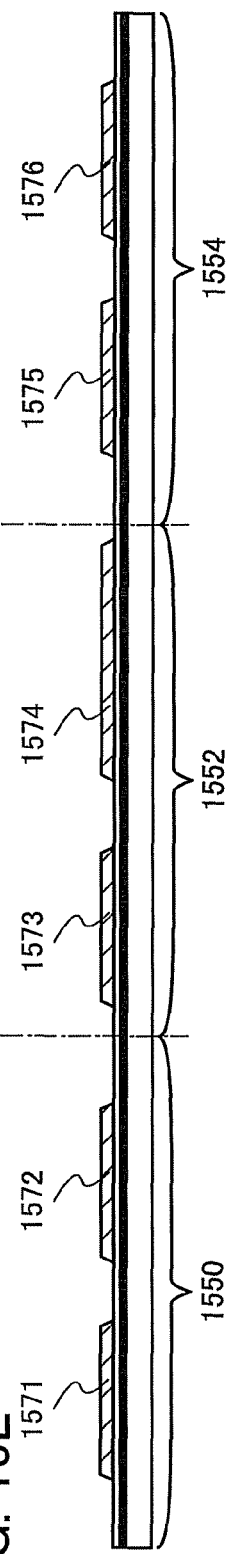

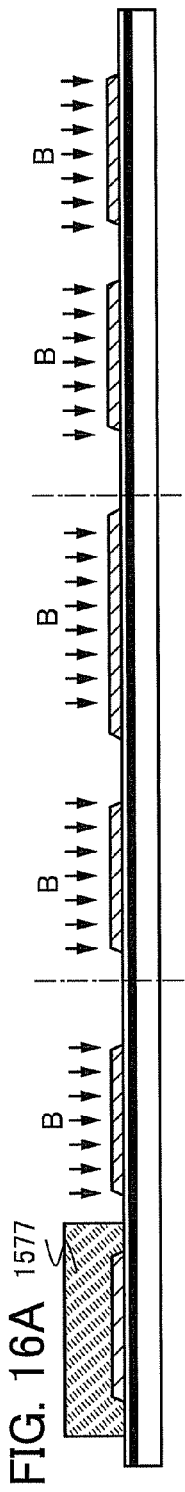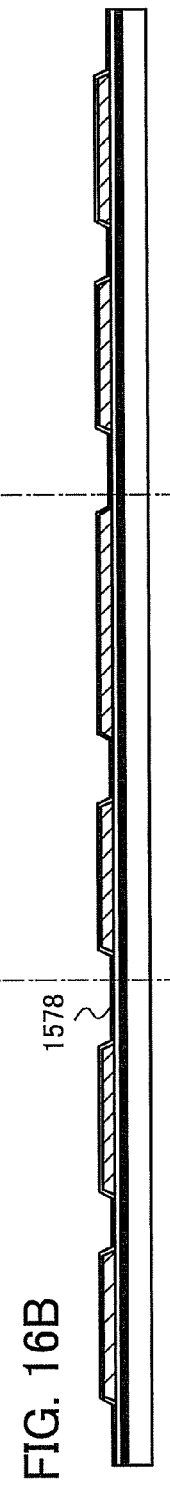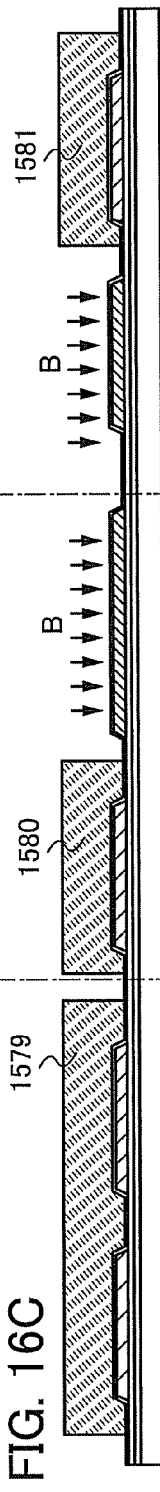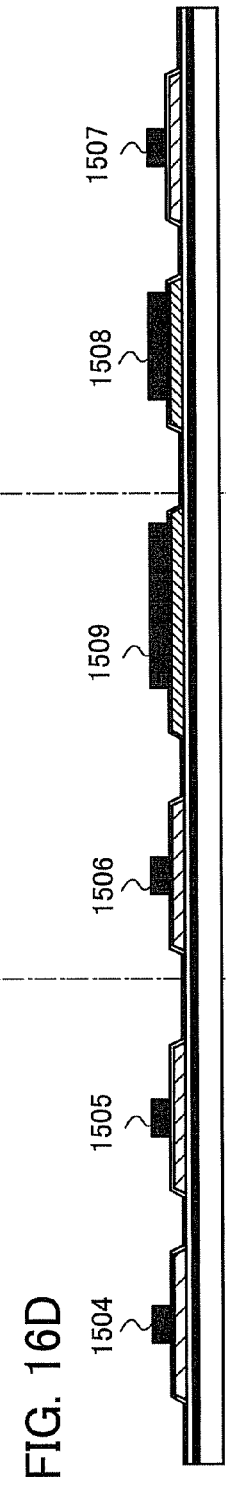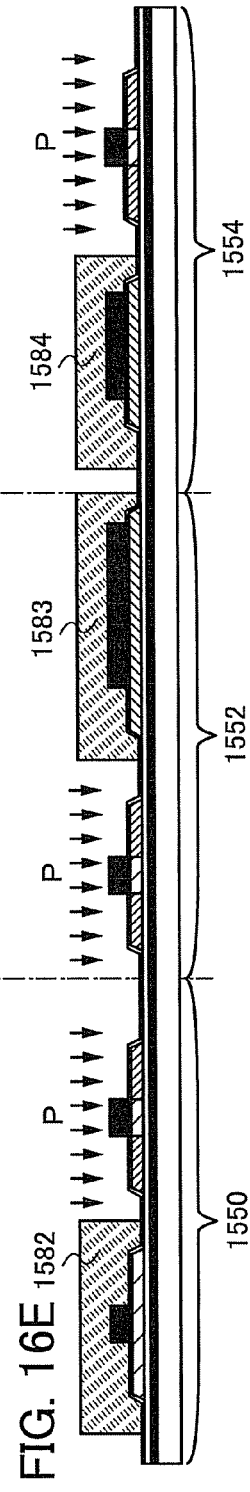
FIG. 16A
FIG. 16B
FIG. 16C
FIG. 16D
FIG. 16E

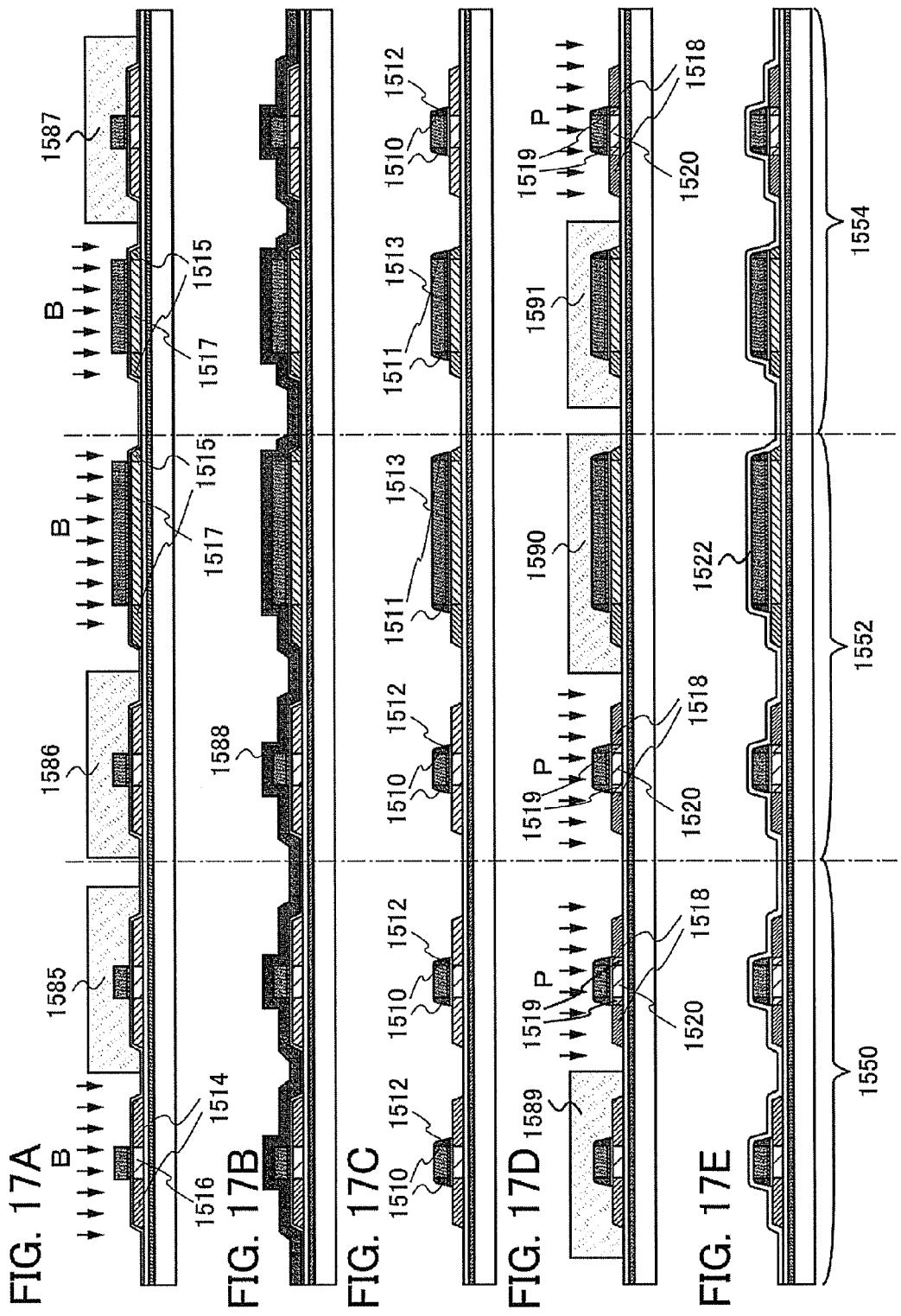

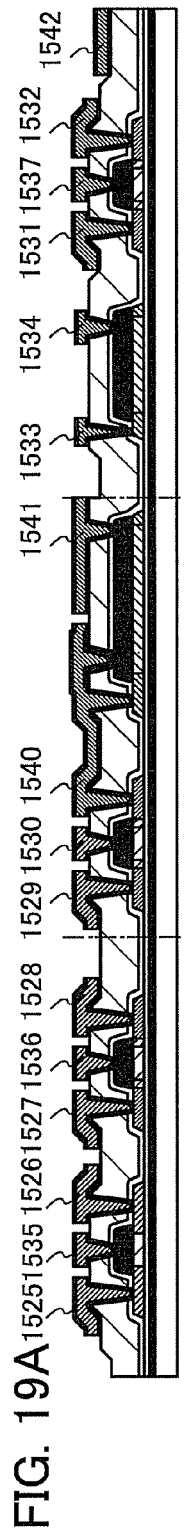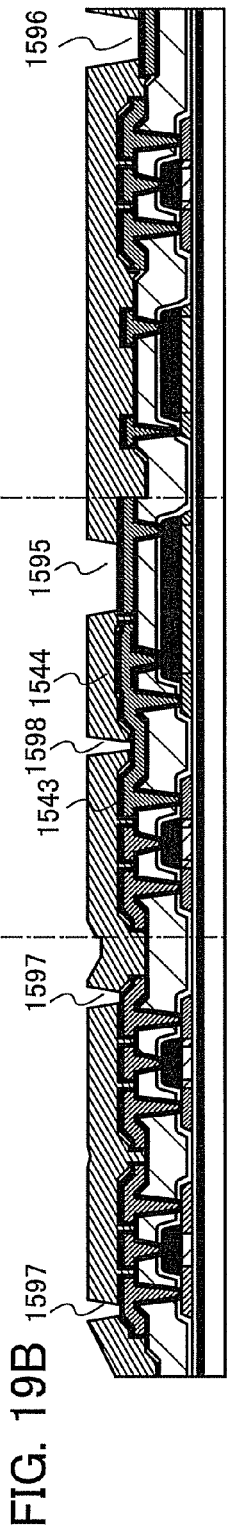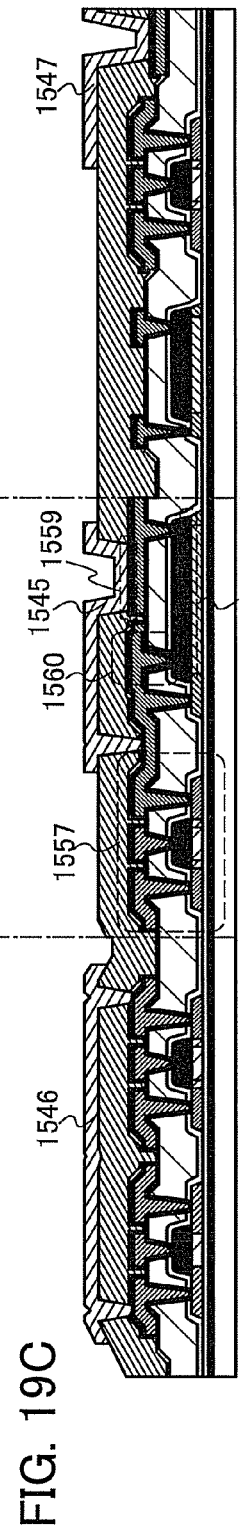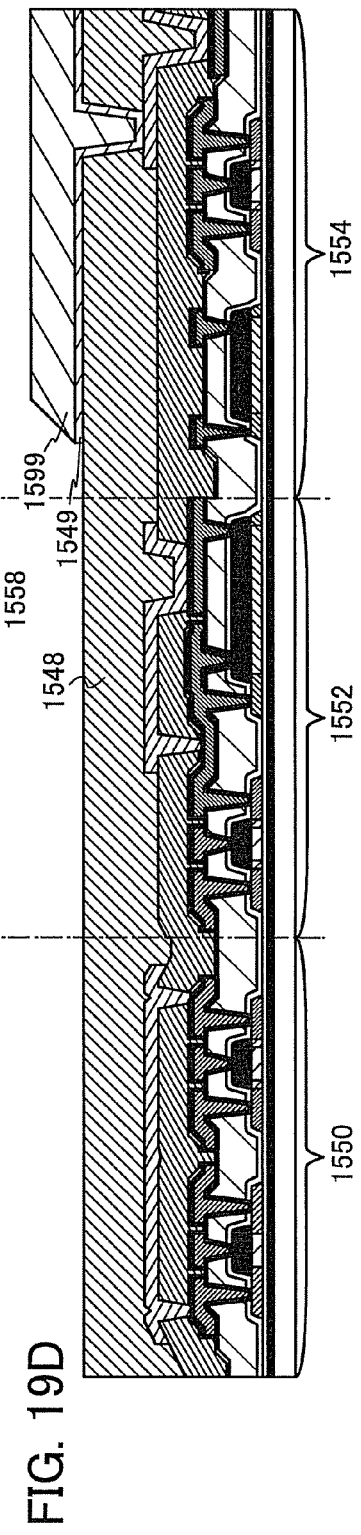

SEMICONDUCTOR MEMORY DEVICE

TECHNICAL FIELD

Technical field relates to semiconductor memory devices. Further, the technical field relates to semiconductor devices on which semiconductor memory devices are mounted.

BACKGROUND ART

In recent years, semiconductor memory devices have been used for a variety of electronic devices. Semiconductor memory devices are classified into volatile memories in which stored data is lost when the power is turned off and nonvolatile memories in which stored data is held even when the power is turned off. These memories are used separately depending on the kind and usage of data.

Among the memories, memories each having a plurality of memory cells which are writable only once, which are one kind of nonvolatile memories, are preferable from a security viewpoint because tampering with data is not easily performed. Note that the memories are referred to as one time programmable memories (hereinafter referred to as OTP memories) or the like.

As one kind of OTP memories, an anti-fuse memory has been proposed in which one of electrodes is formed using metal and an anti-fuse is brought into conduction by reacting amorphous silicon with the metal so as to be silicide (for example, see Reference 1).

In addition, a circuit has been proposed in which a capacitor for compensating electric power in writing (hereinafter referred to as an assist capacitor) is provided in parallel with an OTP memory element (for example, see Reference 2). In particular, in an OTP memory in which silicide reaction occurs in writing, high yield can be realized by providing an assist capacitor.

REFERENCE

Reference 1: Japanese Published Patent Application No. 07-297293
Reference 2: Japanese Published Patent Application No. 02-023653

DISCLOSURE OF INVENTION

However, in the case where an assist capacitor is provided in a memory cell, the area of the memory cell is increased.

In view of the foregoing problem, it is an object to realize a semiconductor memory device whose capacitance value per unit area in a memory cell is increased without increase in the area of the memory cell.

One embodiment of the present invention is a semiconductor memory device in which an assist capacitor formed using a plurality of wirings with an interlayer insulating film interposed therebetween is formed. By using both the assist capacitor and a capacitor formed using a wiring and a gate insulating film, a capacitance value per unit area in the memory cell can be increased. That is, the assist capacitor can be provided without increase in the area of the memory cell.

According to one embodiment of the semiconductor memory device, a plurality of memory cells each including a transistor, a memory element, a first capacitor, and a second capacitor are provided. The transistor includes a first semiconductor film, a first insulating film formed over the first semiconductor film, a first electrode formed over the first insulating film, and a second electrode formed in contact with the first semiconductor film. The memory element includes the first electrode, a second semiconductor film formed over the first electrode, and the second electrode formed over the second semiconductor film. The first capacitor includes the first semiconductor film, the first insulating film, and the first electrode. The second capacitor includes the first electrode, a second insulating film formed over the first electrode, and a second electrode formed over the second insulating film. The memory element is connected in parallel with the first capacitor and the second capacitor. The second capacitor is formed over the first capacitor.

According to one embodiment of the semiconductor memory device, a plurality of memory cells each including a transistor, a memory element, a first capacitor, and a second capacitor are provided. The transistor includes a first semiconductor film, a first insulating film formed over the first semiconductor film, a first electrode formed over the first insulating film, and a second electrode formed in contact with the first semiconductor film. The memory element includes the first electrode, a second semiconductor film formed over the first electrode, and the second electrode formed over the second semiconductor film. The first capacitor includes the first semiconductor film, the first insulating film, and the first electrode. The second capacitor includes the second electrode, a second insulating film formed over the second electrode, and a third electrode formed over the second insulating film. The memory element is connected in parallel with the first capacitor and the second capacitor. The second capacitor is formed over the first capacitor.

In addition, the second semiconductor film included in the memory element is formed using a semiconductor which can cause silicide reaction with the first electrode.

In a semiconductor memory device, a capacitance value per unit area in a memory cell can be increased without increase in the area of the memory cell.

BRIEF DESCRIPTION OF DRAWINGS

In the accompanying drawings:

FIGS. 15A to 15E are cross-sectional views illustrating a method for manufacturing a semiconductor device;

FIGS. 16A to 16E are cross-sectional views illustrating the method for manufacturing a semiconductor device;

FIGS. 17A to 17E are cross-sectional views illustrating the method for manufacturing a semiconductor device;

FIGS. 19A to 19D are cross-sectional views illustrating the method for manufacturing a semiconductor device.

BEST MODE FOR CARRYING OUT THE INVENTION

Hereinafter, embodiments of the disclosed invention will be described with reference to the drawings. Note that the disclosed invention is not limited to the following description. It will be readily appreciated by those skilled in the art that modes and details of the disclosed invention can be changed in various ways without departing from the spirit and scope of the disclosed invention. Therefore, the disclosed invention should not be construed as being limited to the following description of the embodiments.

Embodiment 1

In this embodiment, a structural example of a semiconductor memory device is described.

Figure 1:
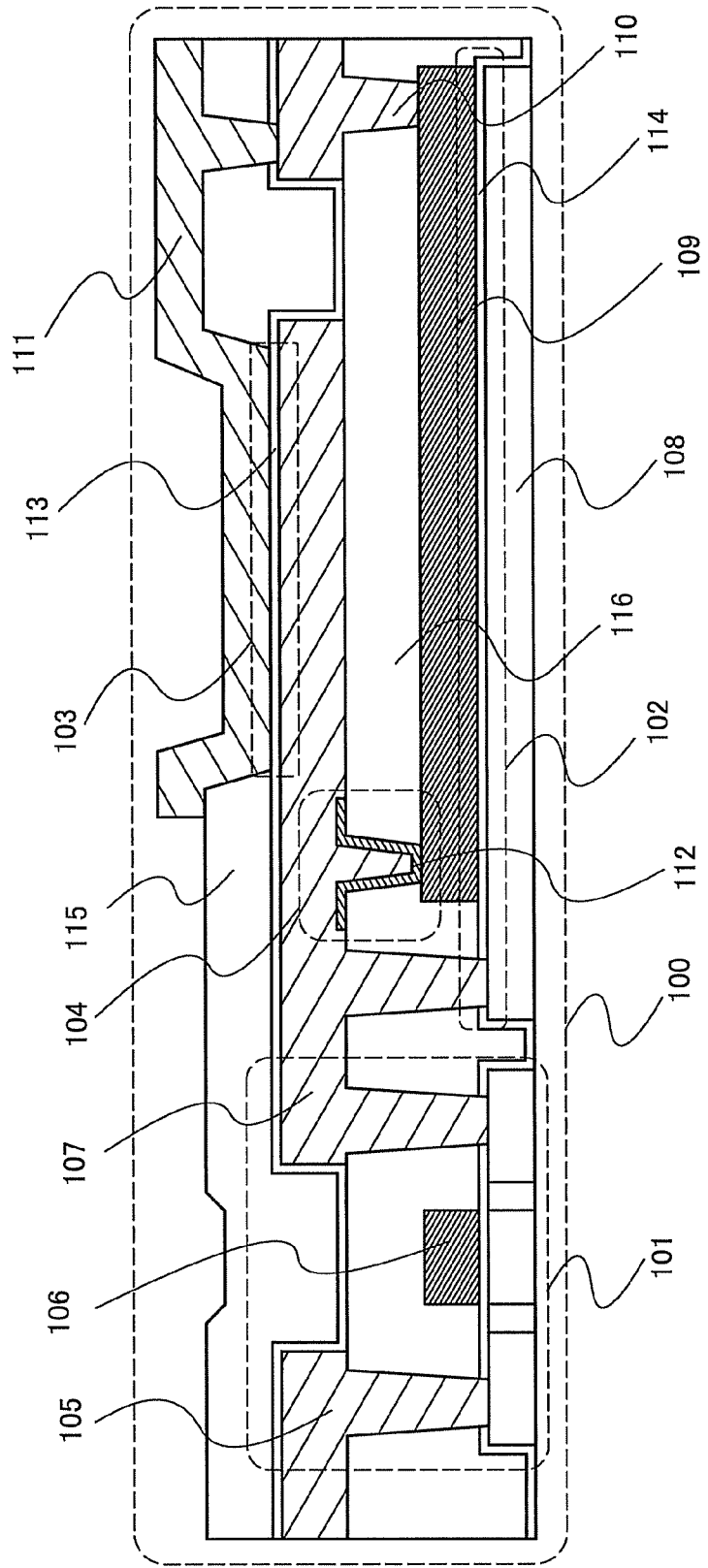
FIG. 1 is a cross-sectional view illustrating a structural example of a semiconductor memory device.

The structure of a semiconductor memory device is described with reference to FIG. 1. Here, FIG. 1 is a cross-sectional view of a memory cell to which one embodiment of the present invention is applied. As illustrated in FIG. 1, a memory cell 100 includes a selection transistor 101, a first assist capacitor 102, a second assist capacitor 103, and a memory element 104.

The selection transistor 101 includes electrodes 105 to 107. The electrode 106 serves as a gate electrode of the selection transistor 101. One of the electrode 105 and the electrode 107 serves as one of a source electrode and a drain electrode of the selection transistor 101. The other of the electrode 105 and the electrode 107 serves as the other of the source electrode and the drain electrode of the selection transistor 101.

The first assist capacitor 102 has a structure in which an insulating film 114 is interposed between an electrode 109 and a semiconductor film 108 including an impurity. In addition, the semiconductor film 108 is electrically connected to the electrode 107. On the other hand, the electrode 109 is electrically connected to an electrode 110.

Here, the first assist capacitor 102 functions as a MOS capacitor. Note that since the electrode 109 is on a cathode side, the polarity of the semiconductor film 108 to which an impurity is added is preferably a p-type.

An insulating film 116 is formed over the electrode 109. In addition, an insulating film 113 is formed over the selection transistor 101 and the electrode 107.

The second assist capacitor 103 has a structure in which the insulating film 113 is interposed between the electrode 107 and an electrode 111. In addition, the electrode 111 is electrically connected to the electrode 110.

An insulating film 115 is formed over the insulating film 113.

The memory element 104 includes the electrodes 107 and 109 and a semiconductor film 112 interposed between the electrodes 107 and 109.

Typically, the memory cells 100 are arranged in matrix. The electrode 105 is electrically connected to a bit line. The electrode 106 is electrically connected to a word line. The electrode 110 is electrically connected to a cathode. That is, between the electrode 107 and the electrode 110, the first assist capacitor 102 and the second assist capacitor 103 are connected in parallel with the memory element 104.

Note that the electrodes 106 and 109 are formed by using a first wiring layer. In addition, the electrodes 105, 107, and 110 are formed by using a second wiring layer. The electrode 111 is formed by using a third wiring layer.

Subsequently, the operation of the semiconductor memory device is described.

The semiconductor film 112 included in the memory element 104 has high resistance in an initial state. The resistance value of the semiconductor film 112 is 100 MΩ or more, preferably 1 GΩ or more.

When high voltage is applied to the electrodes 105 and 106, the selection transistor 101 is turned on, so that the electrode 107 is set to high voltage and the semiconductor film 108 which is electrically connected to the electrode 107 is also set to high voltage.

On the other hand, since the electrode 110 is electrically connected to the cathode, voltage of the electrode 110 is a ground potential and the electrodes 109 and 111 which are electrically connected to the electrode 110 are set to the ground potential.

Therefore, in the memory element 104, a high-voltage potential is generated between the electrode 107 and the electrode 109. In addition, a high-voltage potential is generated between the electrodes in each of the first assist capacitor 102 and the second assist capacitor 103.

When a high-voltage potential is applied between the electrode 107 and the electrode 109, the semiconductor film 112 causes silicide reaction with the electrode 109, so that the resistance value of the semiconductor film 112 is drastically decreased and the electrode 107 and the electrode 109 are short-circuited through the semiconductor film 112. In this case, the first assist capacitor 102 and the second assist capacitor 103 supply electric charge in order to promote silicide formation in the semiconductor film 112.

Since the resistance value of the semiconductor film 112 which is made into silicide in this manner is 10 kΩ or less, preferably 1 kΩ or less, change in resistance value before and after short-circuit is a $10^4$ digit or more, preferably a $10^6$ digit or more. In this manner, the semiconductor film 112 is changed to have a low-resistance conductive property from a high resistance insulating property by silicide reaction. Since the semiconductor film 112 has conductivity after silicide reaction, current flows between the electrode 107 and the electrode 109, that is, data has been written to the memory element 104.

As the insulating films 113 and 114, a silicon nitride ($Si_3N_4$) film or the like is preferably used. The reason for this is as follows: the silicon nitride ($Si_3N_4$) film is not easily oxidized, so that it is an excellent protective film; the silicon nitride ($Si_3N_4$) film has a comparatively high relative dielectric constant of 6.8, so that in the case where a capacitor is formed, a capacitance value per unit area is increased.

Further, the thickness of each of the insulating films 113 and 114 is preferably greater than or equal to 10 nm and less than or equal to 100 nm. Therefore, in lower part of a region in which the second assist capacitor 103 is formed, it is preferable that an object which might be a factor that causes unevenness, such as a contact hole, be not provided. It is preferable that the insulating film 116 and the electrode 107 be formed over the flat electrode 109 included in the first assist capacitor 102 and a portion over the insulating film 116 and the electrode 107 be the region in which the second assist capacitor 103 is formed.

The thickness of the insulating film 115 is greater than the thickness of the insulating film 113 and is preferably approximately 1 μm. By forming the insulating film 115 so as to cover the insulating film 113, short-circuit due to breaking of the insulating film 113 can be prevented. In particular, this advantageous effect is apparent in a portion where a bump is generated in the insulating film 113.

As described above, by providing the second assist capacitor 103 over the first assist capacitor 102, a capacitance value per unit area of the memory cell 100 can be increased.

Embodiment 2

In this embodiment, a structural example of a semiconductor memory device which is different from that of Embodiment 1 is described.

Figure 2:
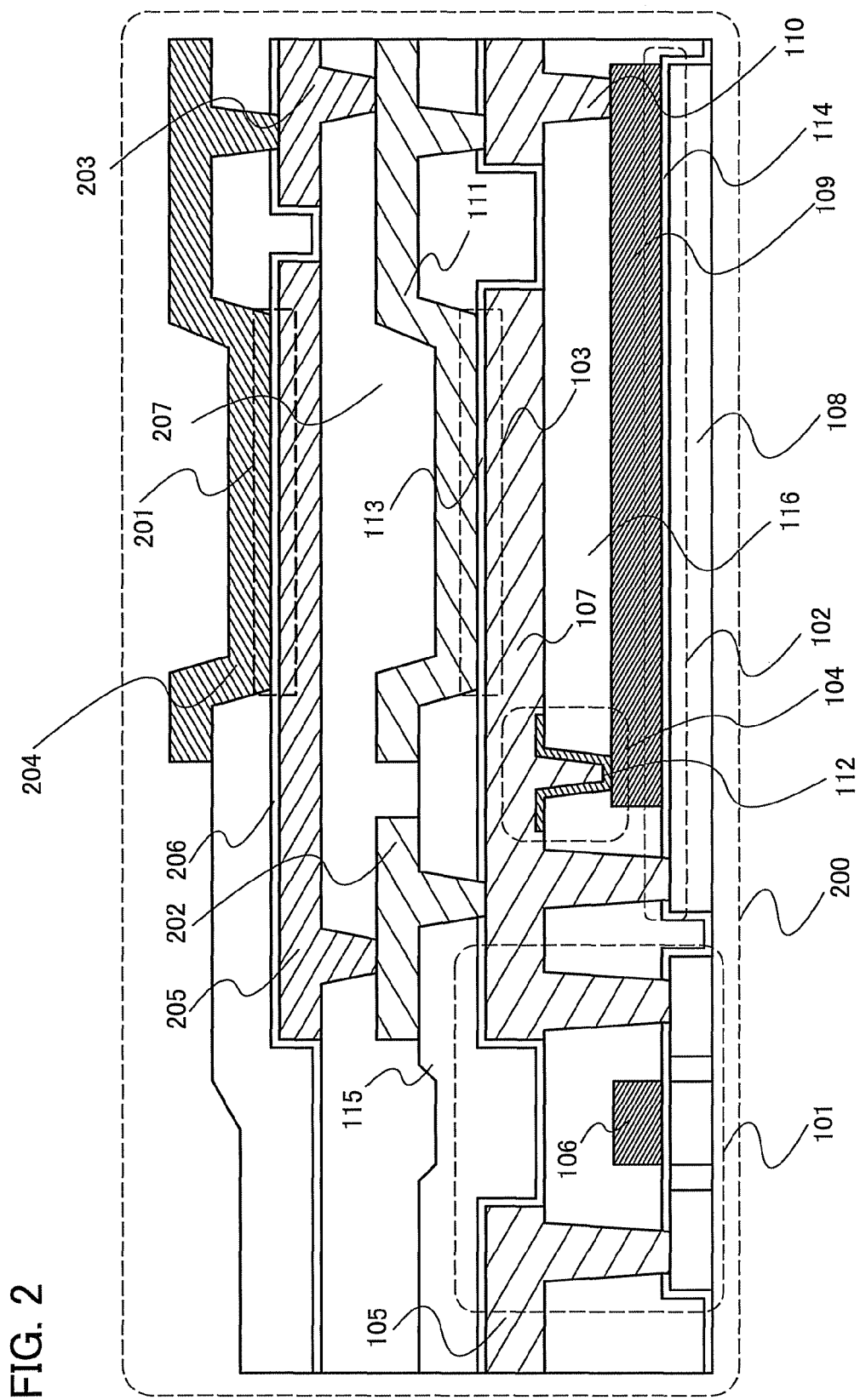
FIG. 2 is a cross-sectional view illustrating a structural example of a semiconductor memory device.

The structure of the semiconductor memory device is described with reference to FIG. 2. Here, FIG. 2 is a cross-sectional view of a memory cell to which one embodiment of the present invention is applied.

A memory cell 200 is a memory cell obtained by stacking wirings over the memory cell 100 illustrated in Embodiment 1. Here, in addition to the selection transistor 101, the first assist capacitor 102, the second assist capacitor 103, and the memory element 104 which are illustrated in Embodiment 1, the memory cell 200 includes a third assist capacitor 201.

The third assist capacitor 201 has a structure in which an insulating film 206 is interposed between an electrode 204 and an electrode 205. Here, the electrode 205 is electrically connected to the electrode 107 through an electrode 202, and the electrode 204 is electrically connected to the electrode 110 through an electrode 203 and the electrode 111. That is, between the electrode 107 and the electrode 110, the first assist capacitor 102, the second assist capacitor 103, and the third assist capacitor 201 are connected in parallel with the memory element 104.

Since the operation of the semiconductor memory device is similar to that of Embodiment 1 except that the third assist capacitor 201 is added, detailed description thereof is omitted. In addition, although only the third assist capacitor 201 is added in the diagram, the structure is not limited to this. As many wirings as possible are stacked, and three or more assist capacitors can be added.

Note that as the insulating film 206, a silicon nitride ($Si_3N_4$) film or the like is preferably used, in a manner similar to that of the insulating film 113. In addition, the thickness of the insulating film 206 is preferably greater than or equal to 10 nm and less than or equal to 100 nm. In addition, in order to prevent damage due to a bump generated under the third assist capacitor 201, a film which has sufficiently large thickness and can be flattened is preferably used as an insulating film 207. For example, the insulating film 207 having a thickness of 1000 nm or more is formed by using polyimide.

As described above, by providing a plurality of assist capacitors over the first assist capacitor 102, a capacitance value per unit area of the memory cell 200 can be increased.

Embodiment 3

In this embodiment, a structural example of a semiconductor memory device which is different from those of Embodiments 1 and 2 is described.

Figure 3:
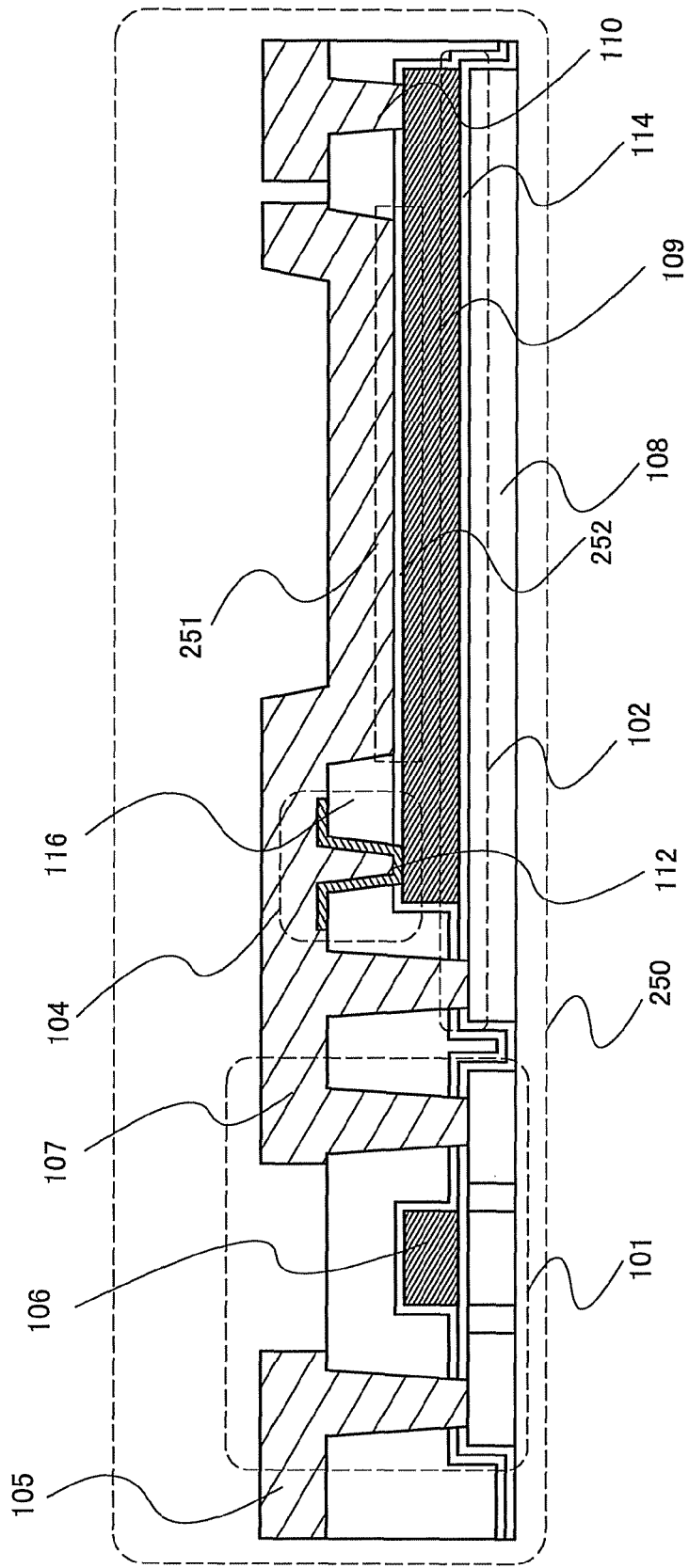
FIG. 3 is a cross-sectional view illustrating a structural example of a semiconductor memory device.

The structure of the semiconductor memory device is described with reference to FIG. 3. Here, FIG. 3 is a cross-sectional view of a memory cell to which one embodiment of the present invention is applied.

A memory cell 250 is a memory cell obtained by eliminating part of wirings and part of interlayer films from the memory cell 100 illustrated in Embodiment 1. Here, the memory cell 250 includes the selection transistor 101, the first assist capacitor 102, a second assist capacitor 251, and the memory element 104.

The second assist capacitor 251 has a structure in which an insulating film 252 is interposed between the electrode 107 and the electrode 109. Note that in a region where the second assist capacitor 251 is provided, the insulating film 116 is selectively removed. That is, between the electrode 107 and the electrode 110, the first assist capacitor 102 and the second assist capacitor 251 are connected in parallel with the memory element 104.

Since the operation of the semiconductor memory device is similar to that of Embodiment 1, detailed description thereof is omitted. As the insulating film 252, for example, a silicon oxynitride film or the like, which is used for activating and hydrogenating the impurity added to the semiconductor film 108, can be used.

With a structure as illustrated in FIG. 3, an assist capacitor can be added without increase in the number of wirings and insulating films. Further, since an insulating film which is formed through an existing process can be used as the insulating film 252, an assist capacitor can be added without addition of a particular process. This embodiment is particularly preferable in the case where multilayer interconnection is not performed in a logic circuit.

As described above, by providing the second assist capacitor 251 over the first assist capacitor 102, a capacitance value per unit area of the memory cell 250 can be increased.

Embodiment 4

In this embodiment, a structural example of a semiconductor memory device is described in detail with reference to FIGS. 4A to 4C.

Figure 4A:
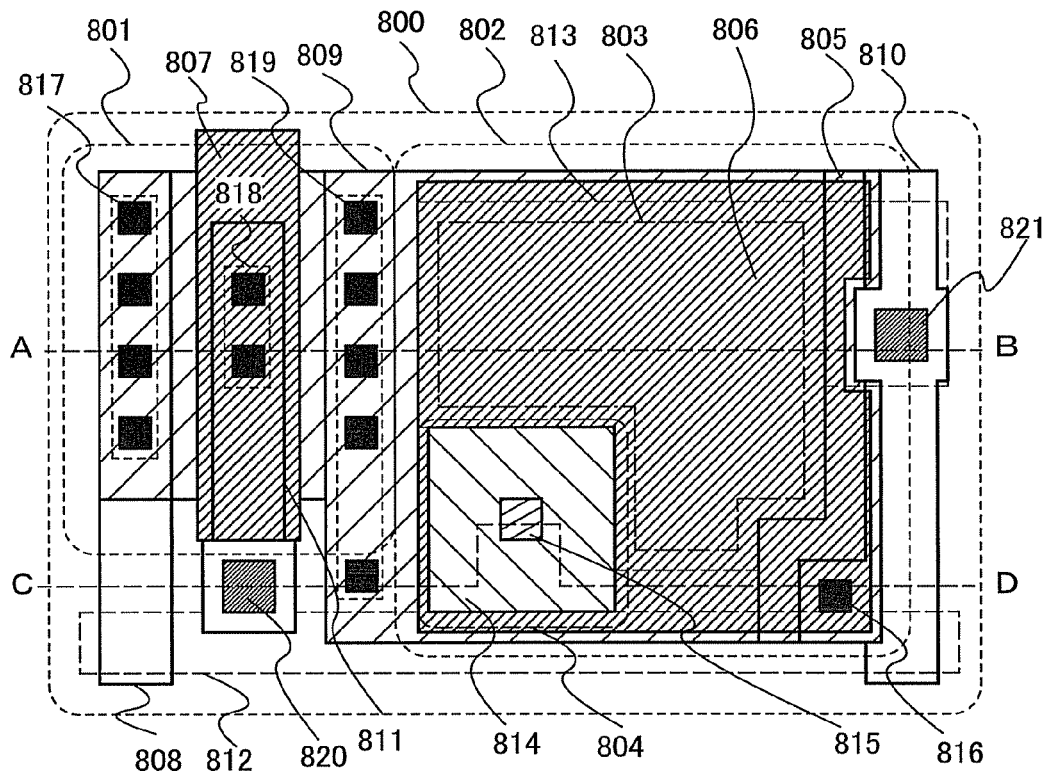
FIG. 4A is a top view illustrating a structural example of a semiconductor memory device.
Figure 4B:
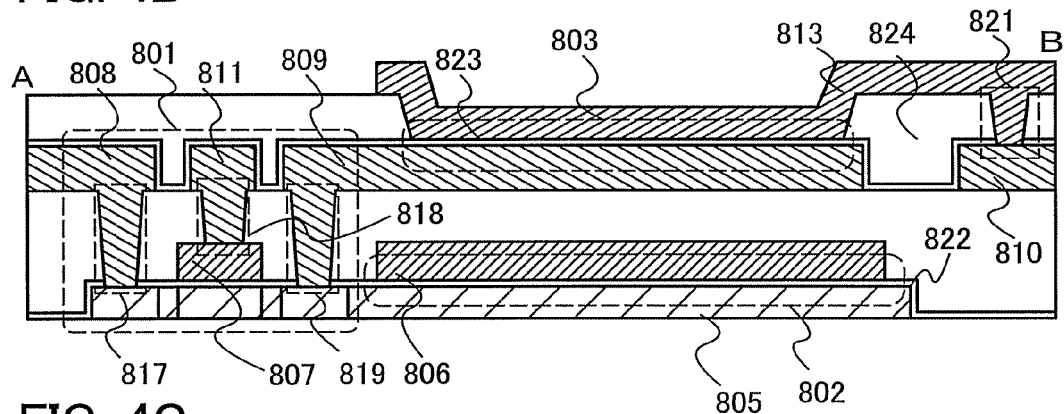
FIGS. 4B and 4C are cross-sectional views illustrating the structural example of the semiconductor memory device.
Figure 4C:
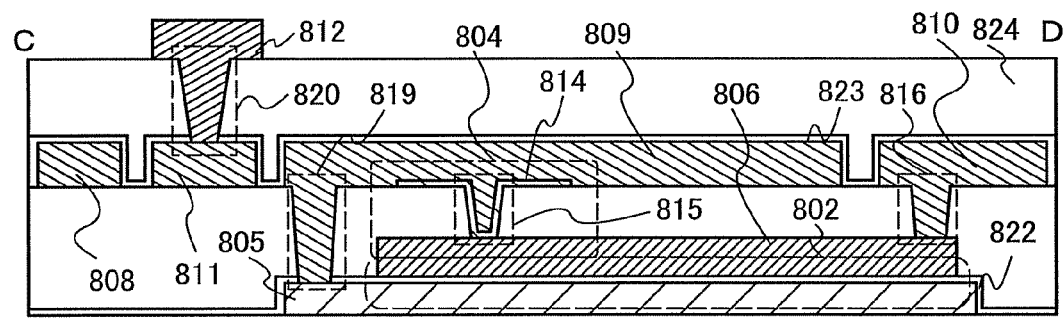

FIGS. 4A to 4C are a top view and cross-sectional views of a memory cell including a selection transistor, an assist capacitor, and a memory element based on actual layout. FIG. 4A is a top view of the memory cell. FIG. 4B is a cross-sectional view taken along broken line A-B in FIG. 4A. FIG. 4C is a cross-sectional view taken along broken line C-D in FIG. 4A. Note that the memory cell has a width of 40 μm and a height of 25 μm.

A memory cell 800 includes a selection transistor 801, a first assist capacitor 802, a second assist capacitor 803, and a memory element 804.

The selection transistor 801 includes electrodes 807, 808, and 809. The electrode 807 serves as a gate electrode of the selection transistor 801. One of the electrode 808 and the electrode 809 serves as one of a source electrode and a drain electrode of the selection transistor 801 through one of a contact hole 817 and a contact hole 819. The other of the electrode 808 and the electrode 809 serves as the other of the source electrode and the drain electrode of the selection transistor 801 through the other of the contact hole 817 and the contact hole 819. The electrode 807 is electrically connected to an electrode 811 through a contact hole 818 and is electrically connected to an electrode 812 through a contact hole 820.

The first assist capacitor 802 has a structure in which an insulating film 822 is interposed between an electrode 806 and a semiconductor film 805 to which an impurity is added. Here, the semiconductor film 805 is electrically connected to the electrode 809 through the contact hole 819. Further, the electrode 806 is electrically connected to an electrode 810 through a contact hole 816.

The second assist capacitor 803 has a structure in which an insulating film 823 is interposed between the electrode 809 and an electrode 813. Here, the electrode 813 is electrically connected to the electrode 810 through a contact hole 821.

The memory element 804 includes the electrodes 806 and 809 and a semiconductor film 814. Here, the electrodes 806 and 809 and the semiconductor film 814 are electrically connected to each other through a contact hole 815.

Typically, the memory cells 800 are arranged in matrix. The electrode 808 is electrically connected to a bit line. The electrode 812 is electrically connected to a word line. The electrode 810 is electrically connected to a cathode. That is, between the electrode 809 and the electrode 810, the first assist capacitor 802 and the second assist capacitor 803 are connected in parallel with the memory element 804. In this case, when the adjacent memory cells are arranged symmetrically with respect to the electrode 810, the electrode 810 can be used in common in the adjacent memory cells, which contributes reduction in layout area.

Note that the electrodes 806 and 807 are formed by using a first wiring layer. The electrodes 808 to 811 are formed by using a second wiring layer. The electrodes 812 and 813 are formed by using a third wiring layer.

Since the operation of the semiconductor memory device in this embodiment is substantially the same as that of Embodiment 1, detailed description thereof is omitted.

This embodiment differs from Embodiment 1 in that the word line is provided in the same layer as the third wiring layer, i.e., an upper electrode of the second assist capacitor 803 in order to reduce the size of the memory cell. Further, this embodiment differs from Embodiment 1 in that a semiconductor film of the selection transistor 801 and the semiconductor film of the first assist capacitor 802 are used without being separated from each other.

As the insulating film 823, a silicon nitride ($Si_3N_4$) film or the like is preferably used. The reason for this is as follows: the silicon nitride ($Si_3N_4$) film is not easily oxidized, so that it is an excellent protective film; the silicon nitride ($Si_3N_4$) film has a comparatively high relative dielectric constant of 6.8, so that in the case where a capacitor is formed, a capacitance value per unit area is increased.

Further, the thickness of the insulating film 823 is preferably greater than or equal to 10 nm and less than or equal to 100 nm. Therefore, in lower part of a region in which the second assist capacitor 803 is formed, it is preferable that an object which might be a factor that causes unevenness, such as a contact hole, be not provided. As illustrated in FIG. 4A, the region in which the second assist capacitor 803 is formed in this embodiment is limited to a region over the flat electrode 806 included in the first assist capacitor 802.

As described above, by providing the second assist capacitor 803 over the first assist capacitor 802, a capacitance value per unit area of the memory cell 800 can be increased.

Embodiment 5

One embodiment of the present invention can be applied not only to an assist capacitor in a memory cell in a semiconductor memory device but also to a capacitor used in a DC-DC converter.

Figure 14:
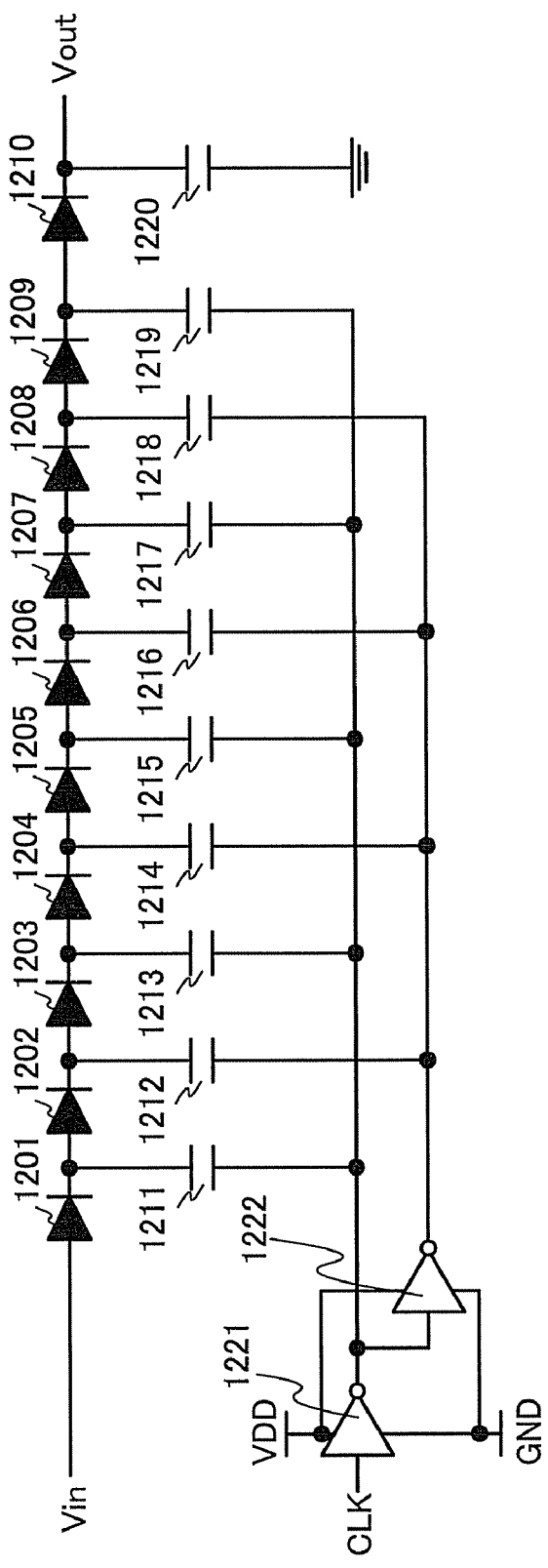
FIG. 14 is a circuit diagram illustrating an example of a DC-DC converter.

FIG. 14 illustrates an example of a DC-DC converter. The DC-DC converter illustrated in FIG. 14 includes a plurality of diodes 1201 to 1210, middle stage capacitors 1211 to 1219, a last stage capacitor 1220, and inverters 1221 and 1222. Note that although not illustrated in FIG. 14 particularly, the DC-DC converter may include a level shifter or the like for converting input power supply voltage Vin into power supply voltage VDD in the case where Vin and VDD are different from each other.

The DC-DC converter boosts the input power supply voltage Vin by a clock CLK and outputs the boosted voltage as output power supply voltage Vout. The CLK and a signal having a phase opposite to that of the CLK are alternately input to ends of the middle stage capacitors 1211 to 1219; boosting is performed through the diodes 1201 to 1209 which are connected to the other ends of the middle stage capacitors 1211 to 1219 as if voltage of the CLK (specifically voltage obtained by subtracting the threshold voltage of the diode from the voltage of the CLK) were boosted every one stage. The last stage capacitor 1220 is used for stabilizing output by accumulating sufficient electric charge.

Figure 5A:
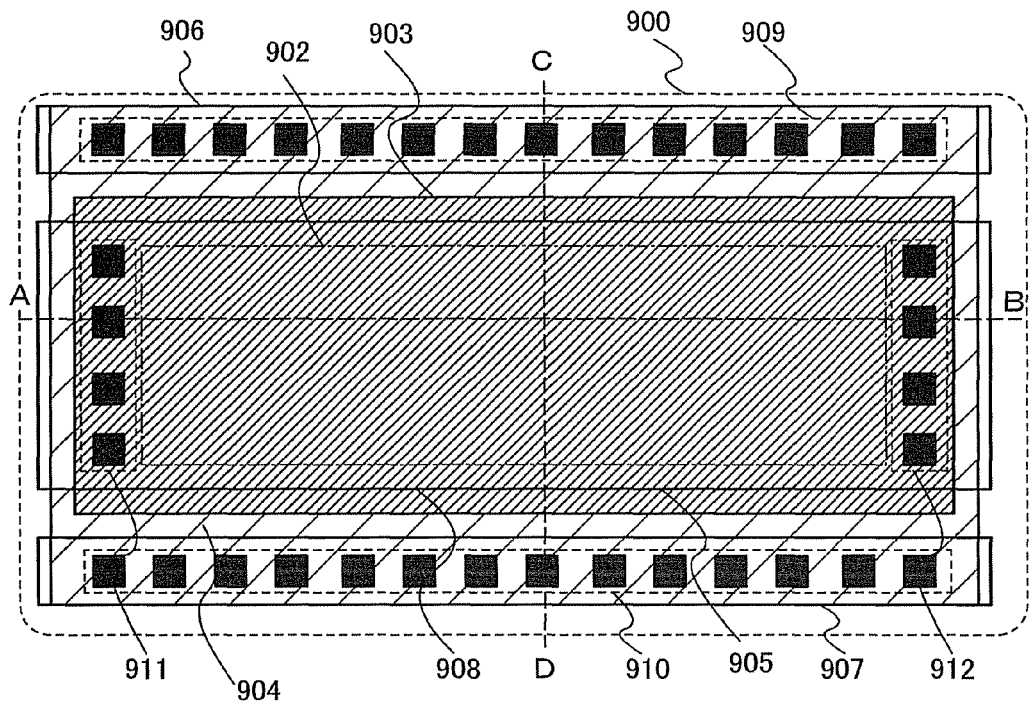
FIG. 5A is a top view illustrating a structural example of a capacitor.
Figure 5B:
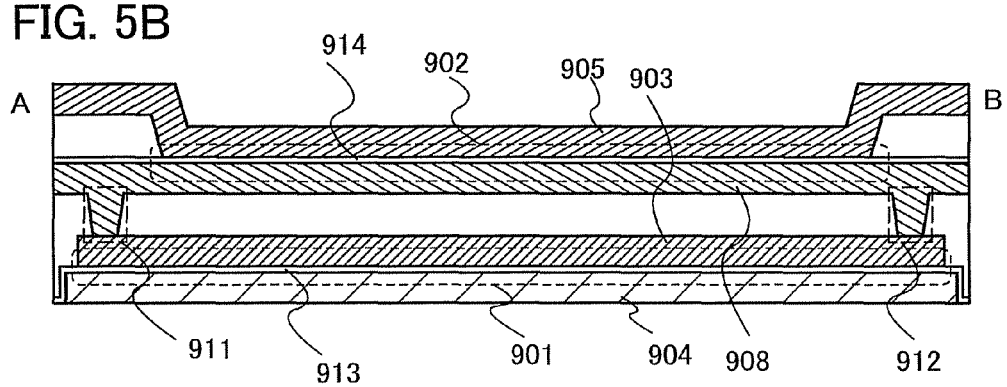
FIGS. 5B and 5C are cross-sectional views illustrating the structural example of the capacitor.
Figure 5C:
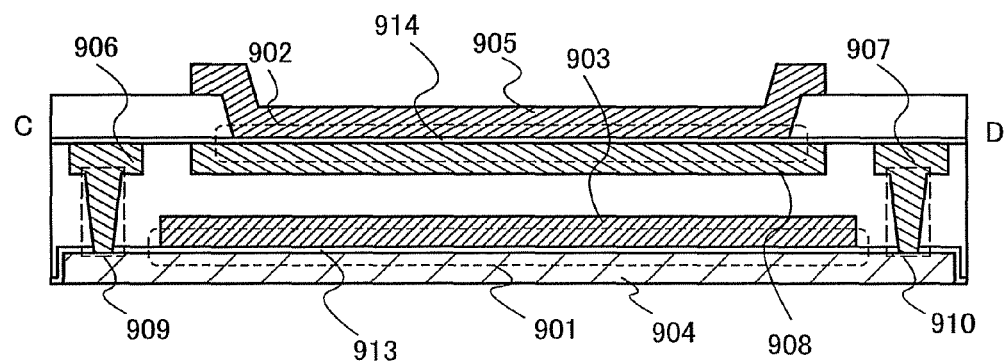

FIGS. 5A to 5C are diagrams in which the present invention is applied to the middle stage capacitors 1211 to 1219 and the last stage capacitor 1220 in FIG. 14. FIG. 5A is a top view of a capacitor 900. FIG. 5B is a cross-sectional view taken along broken line A-B in FIG. 5A. FIG. 5C is a cross-sectional view taken along broken line C-D in FIG. 5A. Note that the capacitor has a width of 50 μm, a height of 28 μm, and a capacitance of 2 pF.

The capacitor 900 includes a first capacitor 901 and a second capacitor 902. Further, the capacitor 900 includes conductive films 903, 905, 906, 907, and 908 and a semiconductor film 904.

The first capacitor 901 has a structure in which an insulating film 913 is interposed between the conductive film 903 and the semiconductor film 904. The semiconductor film 904 is electrically connected to the conductive film 906 through a contact hole 909 and is electrically connected to the conductive film 907 through a contact hole 910. In addition, the conductive film 903 is electrically connected to the conductive film 908 through contact holes 911 and 912.

The second capacitor 902 has a structure in which an insulating film 914 is interposed between the conductive film 905 and the semiconductor film 908. The conductive film 908 is electrically connected to the conductive film 903 through the contact holes 911 and 912. Note that although not illustrated particularly, the conductive film 905 is electrically connected to the conductive films 906 and 907. Therefore, voltage of the conductive film 905 is the same as that of the semiconductor film 904, and voltage of the conductive film 903 is the same as that of the conductive film 908. Accordingly, the capacitance value of the capacitor 900 illustrated in FIGS. 5A to 5C is the sum of the capacitance value of the first capacitor 901 and the capacitance value of the second capacitor 902.

By forming the semiconductor film 904, the conductive film 903, the conductive films 906 to 908, and the conductive film 905 as the semiconductor film 108 in Embodiment 1, the first wiring layer in Embodiment 1, the second wiring layer in Embodiment 1, and the third wiring layer in Embodiment 1, respectively, these films can be formed in the same process as the memory cell. In this case, an impurity which is added to the semiconductor film 904 is preferably the same as the impurity which is added to the semiconductor film 108 in Embodiment 1. Although a MOS capacitor has different polarity depending on the kind of an impurity which is to be added, in the case where an impurity which imparts p-type conductivity is added, the conductive film 908 may be electrically connected to a CLK side or an inverted signal side and the conductive films 906 and 907 may be electrically connected to a diode side.

As the insulating film 914, a silicon nitride ($Si_3N_4$) film or the like is preferably used. The reason for this is as follows: the silicon nitride ($Si_3N_4$) film is not easily oxidized, so that it is an excellent protective film; the silicon nitride ($Si_3N_4$) film has a comparatively high relative dielectric constant of 6.8, so that in the case where a capacitor is formed, a capacitance value per unit area is increased.

Further, the thickness of the insulating film 914 is preferably greater than or equal to 10 nm and less than or equal to 100 nm. Therefore, in lower part of a region in which the second capacitor 902 is formed, it is preferable that an object which might be a factor that causes unevenness, such as a contact hole, be not provided. As illustrated in FIG. 5A, the region in which the second capacitor 902 is formed in this embodiment is limited to a region over the flat conductive film 903 included in the first capacitor 901.

Although an example in which three conductive films are provided as in Embodiments 1 and 4 is illustrated in this embodiment, the number of conductive films is not limited to the above number as a matter of course. Four or more conductive films may be provided as in Embodiment 2, or two conductive films may be provided as in Embodiment 3.

As described above, by providing the second capacitor 902 over the first capacitor 901, a capacitance value per unit area in the DC-DC converter can be increased. By combining this structure with any of the memory cells illustrated in Embodiments 1 to 4, reduction in area of a memory circuit can be more effectively achieved.

Embodiment 6

In this embodiment, a specific structure of a semiconductor memory device is described with reference to a drawing.

Figure 6:
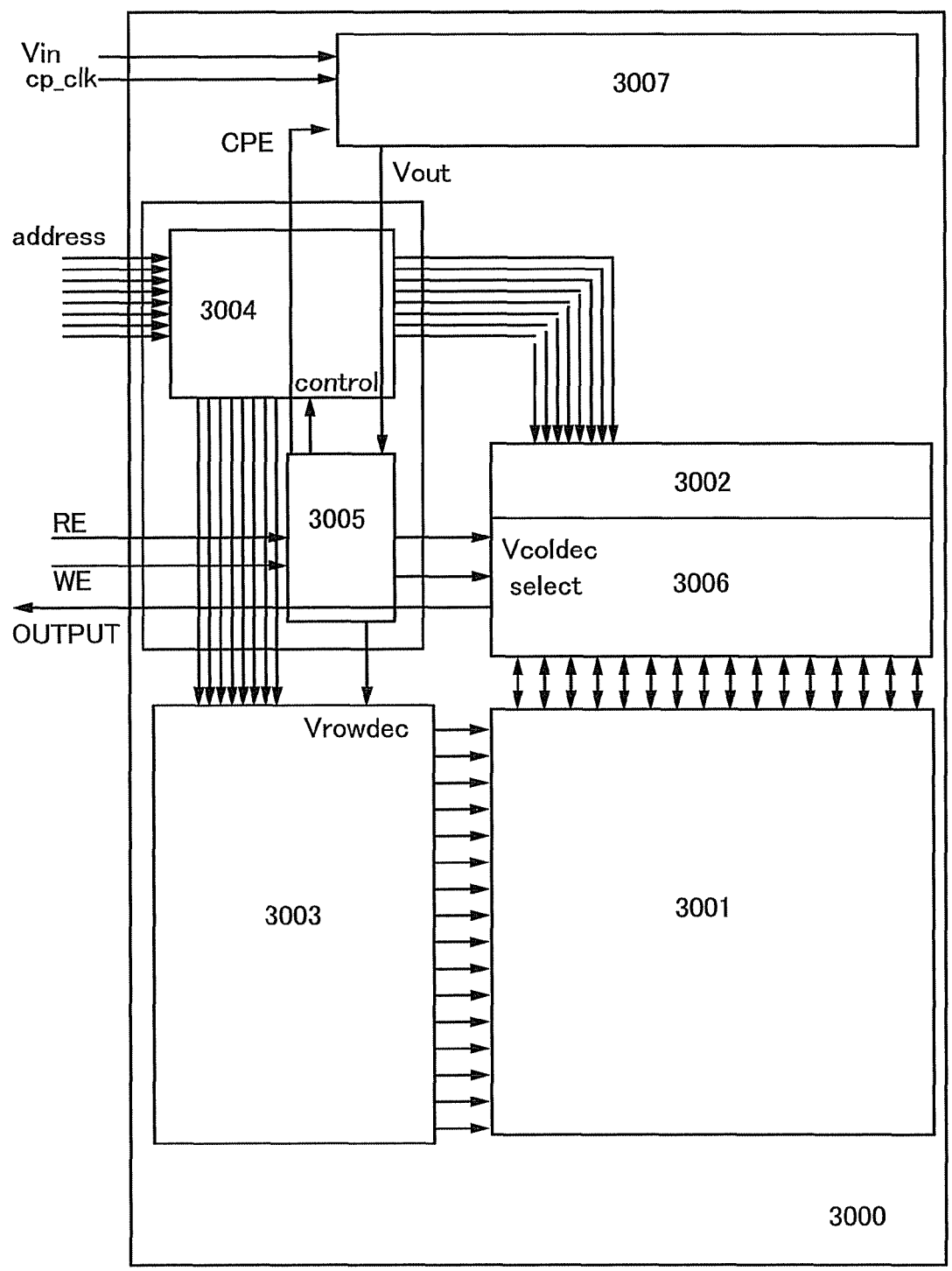
FIG. 6 is a block diagram of a module of a memory circuit.

FIG. 6 is a block diagram of a memory cell and circuits necessary for driving the memory cell, which are modularized. As illustrated in FIG. 6, a memory circuit 3000 includes a memory cell array 3001, a column decoder 3002, a row decoder 3003, an address selector 3004, a selector 3005, a reading/writing circuit 3006, and a DC-DC converter 3007. Here, the memory cell array 3001 includes a plurality of memory cells arranged in matrix.

Next, the operation of the memory circuit 3000 is described. A read enable signal (RE), a write enable signal (WE), an address signal (address), and a boosting clock signal (cp_clk) are input to the memory circuit 3000 as operation signals, and boosting input voltage Vin is applied to the memory circuit 3000 as power supply voltage. Note that although not illustrated particularly, power supply voltage necessary for driving the circuit, such as VDD and GND, is also applied as operating power supply voltage.

The RE signal and the WE signal are input to the selector 3005, so that the operation of a memory is determined. For example, in the case where the RE signal is active and the WE signal is non-active, reading operation is performed. Alternatively, in the case where the WE signal is active and the RE signal is non-active, writing operation is performed. In the case where the WE signal and the RE signal are both non-active, the memory is in a standby state.

In the case of performing the writing operation, a boosting enable signal (CPE) is generated and the generation of the boosting enable signal (CPE) may be a condition of the operation of the DC-DC converter. Thus, increase in current consumption due to unnecessary boosting can be suppressed. Further, in the case of performing the writing operation or the reading operation, by generating a control signal (control) and inputting the control signal to the address selector 3004, a malfunction due to driving of the decoder in the standby state can be prevented.

The address signal branches through the address selector 3004 and is input to the column decoder 3002 and the row decoder 3003. Each of the column decoder 3002 and the row decoder 3003 includes a plurality of decoders. In each of the column decoder 3002 and the row decoder 3003, only one of the plurality of decoders is driven in accordance with combination of values of the address signals. In addition, in accordance with combination of decoders which are driven, a memory cell for performing writing or reading is uniquely determined in the memory cell array 3001. As described above, in the state where neither writing nor reading is performed, a signal which is input to the decoder is made to be non-active with the control signal generated in the selector 3005 so that the decoder is not selected.

The reading/writing circuit 3006 which is connected to the column decoder 3002 drives either a reading circuit or a writing circuit which is provided inside with a selection signal (select) generated in the selector 3005. In a writing state, the writing circuit is driven, and in a reading state, the reading circuit is driven. The reading circuit reads data of 0 or data of 1 from the state of an accessed memory cell and outputs the data as data output (OUTPUT).

The DC-DC converter 3007 is operated by the cp_clk signal which is an input signal from the outside when the CPE signal generated in the selector 3005 is active and amplifies the power supply voltage Vin which is applied from the outside so that it is output as the Vout. The Vout is input to the selector 3005, and the selector 3005 applies the Vout as power supply voltage (Vcoldec) of the column decoder 3002 and power supply voltage (Vrowdec) of the row decoder 3003 when the circuit performs the writing operation.

As the structure of the DC-DC converter 3007, a known structure may be used. For example, a circuit as illustrated in Embodiment 5 can be used.

This structure can be applied to the memory cell included in the memory cell array 3001 and a middle stage capacitor and a last stage capacitor which are included in the DC-DC converter 3007. Specifically, by applying the content described in Embodiments 1 to 4 to the memory cell, the area of the memory cell array 3001 can be reduced. Further, by applying the content described in Embodiment 5 to the middle stage capacitor and the last stage capacitor, the area of the DC-DC converter 3007 can be reduced. Accordingly, the area of the memory circuit 3000 can be reduced.

Embodiment 7

In this embodiment, a semiconductor device on which a semiconductor memory device according to one embodiment of the present invention is mounted is described with reference to a drawing.

The semiconductor device includes a memory circuit, stores necessary information in the memory circuit, and exchanges information with the outside by using a contactless method, for example, wireless communication. The semiconductor device utilizing this feature has an application for a unique authentication system in which unique information of an object or the like is stored and the object is recognized by reading the information, for example. In order to use the semiconductor device for such an application, higher reliability is necessary because data related to unique information is stored so that an object is recognized, for example.

The semiconductor device is described with reference to FIG. 7. Here, FIG. 7 is a block diagram illustrating the structure of the semiconductor device.

Figure 7:
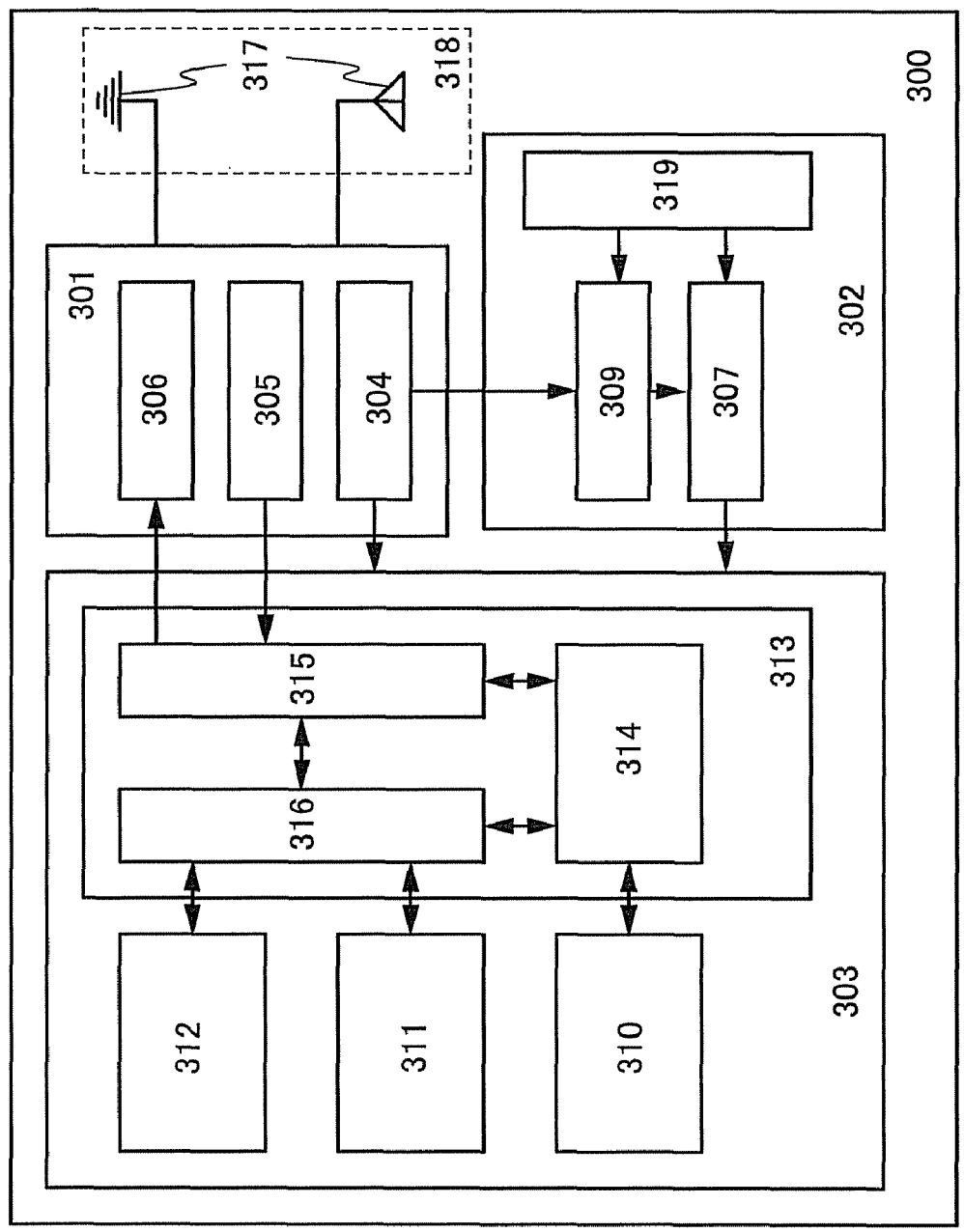
FIG. 7 is a block diagram illustrating a structure of a semiconductor device.

As illustrated in FIG. 7, a semiconductor device 300 includes an RF circuit 301, a clock generation circuit 302, a logic circuit 303, and an antenna 317 in an antenna portion 318. Note that although not illustrated in FIG. 7, the semiconductor device 300 transmits and receives wireless signals to and from an external circuit such as a wireless communication device through the antenna 317. Note that data transmission methods are roughly classified into the following three methods: an electromagnetic coupling method by which a pair of coils is provided so as to be faced with each other and communicates with each other by mutual induction, an electromagnetic induction method by which communication is performed using an induction field, and an electromagnetic wave method by which communication is performed using an electromagnetic wave. Any of these methods can be used in this embodiment.

Next, the structure of each circuit is described. The RF circuit 301 includes a power supply circuit 304, a demodulation circuit 305, and a modulation circuit 306. In addition, the clock generation circuit 302 includes a frequency divider circuit 307, a counter circuit 309, and a reference clock generation circuit 319. Further, the logic circuit 303 has a function of performing arithmetic processing and includes a controller 313, a CPU (also referred to as a central processing unit) 310, a ROM (read only memory) 311, and a RAM (random access memory) 312.

In addition, the controller 313 includes a CPU interface 314, an RF interface 315, and a memory controller 316.

Further, in the RF circuit 301, the power supply circuit 304 includes a rectifier circuit and a storage capacitor and has a function of generating power supply voltage from received signals and supplying the power supply voltage to the other circuits. The demodulation circuit 305 includes a rectifier circuit and an LPF (low pass filter) and has a function of extracting a command or data from communication signals. The modulation circuit 306 has a function of modulating transmission data, and modulated data is transmitted as a transmission signal from the antenna 317.

Next, the operation of the semiconductor device is described. First, signals transmitted from an external communication device are received by the semiconductor device. The received signals which are input to the semiconductor device are demodulated by the demodulation circuit 305 and then input to the RF interface 315 in the controller 313. The received signals which are input to the RF interface 315 are subjected to arithmetic processing by the CPU 310 through the CPU interface 314. In addition, with the received signals which are input to the RF interface 315, access to the ROM 311 and the RAM 312 is performed through the memory controller 316.

Then, transmission data is generated after arithmetic processing is performed by the CPU 310 and data is input and output to and from the ROM 311 and the RAM 312, and the transmission data is modulated as a signal by the modulation circuit 306 and is transmitted from the antenna 317 to the external communication device.

In this embodiment, the semiconductor memory device can be mounted as the ROM 311 or the RAM 312 of the semiconductor device, or a different memory circuit. By mounting the semiconductor memory device according to one embodiment of the present invention, a smaller semiconductor device can be provided. Further, since the semiconductor memory device according to one embodiment of the present invention can be manufactured at low cost, manufacturing cost of the semiconductor device can be reduced.

Note that this embodiment can be combined with any of the other embodiments as appropriate.

Embodiment 8

In this embodiment, a method for manufacturing a semiconductor device on which a semiconductor memory device according to one embodiment of the present invention is mounted is described with reference to drawings.

A semiconductor device in this embodiment is described with reference to FIGS. 8A and 8B. Here, FIG. 8A is a schematic view illustrating the structure of the semiconductor device in this embodiment, and FIG. 8B is a cross-sectional view illustrating the structure of the semiconductor device in this embodiment.

Figure 8A:
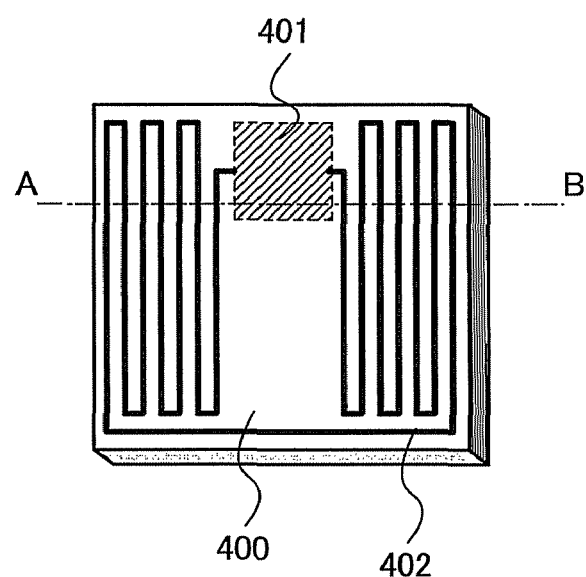
FIG. 8A is a schematic view illustrating a structure of a semiconductor device.

As illustrated in FIG. 8A, the semiconductor device in this embodiment includes a substrate 400, an element portion 401 which is provided over the substrate 400, and an antenna 402 which is electrically connected to the element portion 401.

The element portion 401 includes a plurality of elements such as memory elements and has a function of processing signals received from the outside. The antenna 402 has a function of transmitting data in the semiconductor device.

Figure 8B:
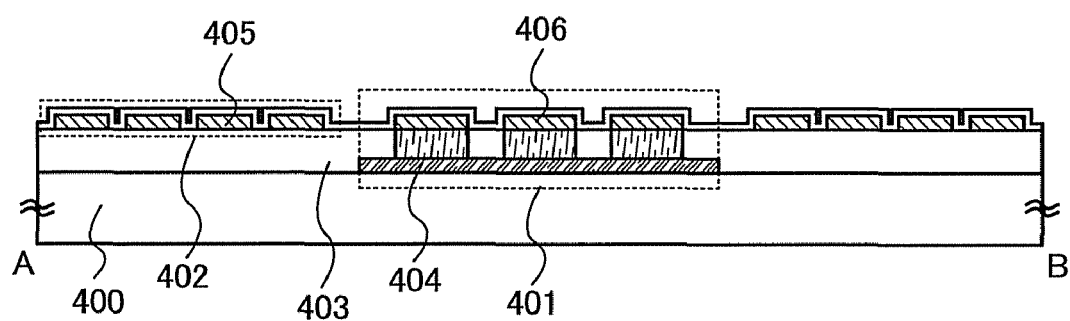
FIG. 8B is a cross-sectional view illustrating the structure of the semiconductor device.

Further, as illustrated in FIG. 8B, the semiconductor device in this embodiment includes an element 404 which is provided over the substrate 400, an interlayer film 403 which is provided over part of the element 404 and the substrate 400, a conductive film 405 which is provided over the interlayer film 403 and functions as the antenna 402, and the element portion 401 having a conductive film 406 which is electrically connected to the element 404.

Note that although the conductive film 405 which functions as the antenna 402 is provided in the same layer as the conductive film 406 in the structure of FIG. 8B, the structure is not limited to this. A structure can also be used in which after the element portion 401 is provided, an insulating film is additionally provided so as to cover the element portion and the conductive film 405 is provided over the insulating film.

Figure 9A:
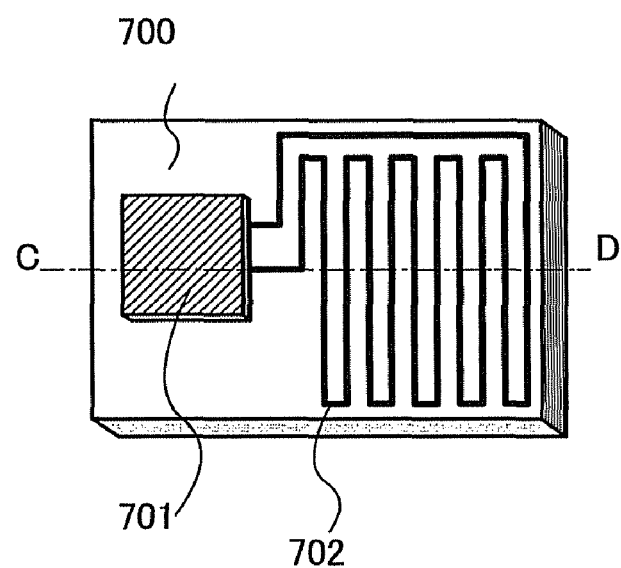
FIG. 9A is a schematic view illustrating a structure of a semiconductor device.

Furthermore, the structure of the semiconductor device is not limited to the structure of FIGS. 8A and 8B. A different structural example of the semiconductor device is described with reference to FIGS. 9A and 9B. FIG. 9A is a schematic view illustrating a different structure of the semiconductor device in this embodiment, and FIG. 9B is a cross-sectional view illustrating the different structure of the semiconductor device in this embodiment.

As illustrated in FIG. 9A, the semiconductor device includes a substrate 700, an element portion 701 which is provided over the substrate 700, and an antenna 702 which is electrically connected to the element portion 701.

In a manner similar to that of the structure of FIGS. 8A and 8B, the element portion 701 includes a plurality of elements such as memory elements and has a function of processing signals received from the outside. The antenna 702 has a function of transmitting data in the semiconductor device.

Figure 9B:
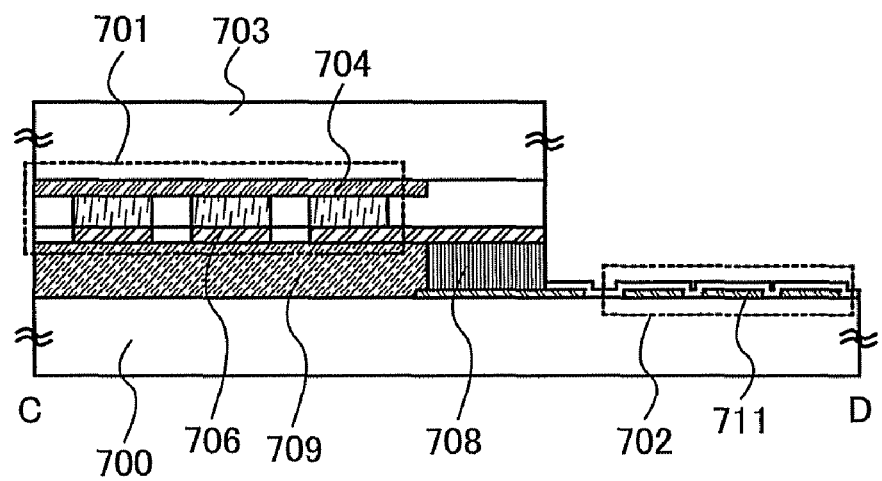
FIG. 9B is a cross-sectional view illustrating the structure of the semiconductor device.

Further, as illustrated in FIG. 9B, the semiconductor device in this embodiment includes the substrate 700, a conductive film 711 which serves as the antenna 702 and a resin 709, which are provided over part of the substrate 700, a conductive layer 708 including a conductive particle which is provided over part of the conductive film 711, a conductive film 706 which is provided over part of the resin 709 and part of the conductive layer 708, the element portion 701 including the conductive film 706 and an element 704 which is provided over the conductive film 706, and a substrate 703 which is provided over the element portion 701.

In the case of the structure of FIGS. 9A and 9B, a terminal portion is provided, and the conductive film 706 is used as the terminal portion. In addition, the substrate 703 on which the element portion 701 and the conductive film 706 are provided is attached to the substrate 700 over which the antenna 702 is provided so that the conductive film 706 and the conductive film 711 are electrically connected to each other through the conductive layer 708.

In this embodiment, the semiconductor memory device according to one embodiment of the present invention can be used as memory devices in the element portion 401 in FIGS. 8A and 8B and the element portion 701 in FIGS. 9A and 9B. By using the semiconductor memory device according to one embodiment of the present invention, a semiconductor device having high reliability can be manufactured at low cost.

When a plurality of the element portions 401 in FIGS. 8A and 8B and a plurality of the element portions 701 in FIGS. 9A and 9B are formed over a large substrate in advance and then cut into separate sections, the element portion 401 and the element portion 701 can be formed at low cost. As the substrate 400 in FIGS. 8A and 8B and the substrate 700 and the substrate 703 in FIGS. 9A and 9B used in this case, a glass substrate, a quartz substrate, a ceramic substrate, a metal substrate (e.g., a stainless steel substrate), a semiconductor substrate (e.g., a silicon substrate), or the like can be used. Alternatively, a flexible substrate or the like formed using polyethylene terephthalate (PET), polyethylene naphthalate (PEN), polyether sulfone (PES), acrylic, or the like can be used as a plastic substrate.

A plurality of transistors, memory elements, and the like which are included in the element portion 401 in FIGS. 8A and 8B and the element portion 701 in FIGS. 9A and 9B are not limited to being provided in the same layer, and can be provided in a plurality of layers. When the element portion 401 in FIGS. 8A and 8B and the element portion 701 in FIGS. 9A and 9B are provided in a plurality of layers, an interlayer insulating film is used. As the material of the interlayer insulating film, a resin material such as an epoxy resin or an acrylic resin, a light-transmitting resin material such as a polyimide resin, a compound material which includes a siloxane material, such as a siloxane resin, a material which contains a water-soluble homopolymer and a water-soluble copolymer, or an inorganic material can be used. Alternatively, a layered structure can be used by selecting plural kinds of the above materials. A siloxane material corresponds to a material including a Si—O—Si bond. Siloxane has a skeleton structure by the bond of silicon (Si) and oxygen (O). An organic group (e.g., an alkyl group or an aryl group) or a fluoro group may be used as a substituent. A fluoro group may be contained in the organic group. Further, the interlayer insulating film can be formed by CVD, sputtering, an SOG method, a droplet discharge method, a screen printing method, or the like.

Moreover, as the material of the interlayer insulating film, a material with low dielectric constant is preferably used for reducing parasitic capacitance which is generated between the layers. When the parasitic capacitance is reduced, high-speed operation and reduction in power consumption can be realized.

The conductive film 405 and the conductive film 406 in FIGS. 8A and 8B and the conductive film 706 and the conductive film 711 in FIGS. 9A and 9B can be formed by CVD, sputtering, a printing method such as a screen printing method or a gravure printing method, a droplet discharge method, a dispenser method, a plating method, or the like. The conductive film 405 and the conductive film 406 in FIGS. 8A and 8B and the conductive film 706 and the conductive film 711 in FIGS. 9A and 9B can be formed with a single-layer structure or a layered structure of an element selected from aluminum, titanium, silver, copper, gold, platinum, nickel, palladium, tantalum, or molybdenum, or an alloy material or a compound material which contains any of these elements as its main component.

For example, in the case of forming the conductive film 405 and the conductive film 406 in FIGS. 8A and 8B and the conductive film 706 and the conductive film 711 in FIGS. 9A and 9B by a screen printing method, the conductive film 405 and the conductive film 406 in FIGS. 8A and 8B and the conductive film 706 and the conductive film 711 in FIGS. 9A and 9B can be formed by selectively printing a conductive paste where conductive particles having a grain diameter of several nanometers to several tens micrometers are dissolved or dispersed in an organic resin. As the conductive particles, metal particles of one or more of silver, gold, copper, nickel, platinum, palladium, tantalum, molybdenum, titanium, and the like; fine particles of silver halide; or dispersible nano particles can be used. In addition, as the organic resin included in the conductive paste, one or more selected from organic resins functioning as a binder of metal particles, a solvent, a dispersible agent, and a coating material can be used. Typically, an organic resin such as an epoxy resin or a silicone resin can be used. Further, in forming the conductive films, baking is preferably performed after the conductive paste is pushed out. For example, in the case of using fine particles (e.g., particles with a grain diameter greater than or equal to 1 nm and less than or equal to 100 nm) containing silver as its main component as the material of the conductive paste, the conductive film can be obtained by baking the conductive paste at temperatures within the range of 150 to 300° C. so that the conductive paste is hardened. Alternatively, a fine particle which includes solder or lead-free solder as its main component may be used as a fine particle. In this case, it is preferable that a fine particle having a grain diameter of 20 μm or less be used. By using solder or lead-free solder, the conductive films can be formed at low cost.

When the integrated circuit or the like is provided over the element portion 401 in FIGS. 8A and 8B and the element portion 701 in FIGS. 9A and 9B, for example, transistors which include semiconductor films formed with a single-layer structure or a layered structure of any of an amorphous semiconductor, a microcrystalline semiconductor (also referred to as a microcrystal semiconductor), a polycrystalline semiconductor, an organic semiconductor, and the like can be used as transistors included in the element portions. In order to obtain transistors with favorable characteristics, semiconductor films which are crystallized by using a metal element as a catalyst or semiconductor films which are crystallized by laser irradiation are preferably used. Alternatively, as semiconductor films, semiconductor films which are formed by plasma-enhanced CVD by using an $SiH_4/F_2$ gas or an $SiH_4/H_2$ gas (an Ar gas), or semiconductor films which are irradiated with a laser can be used.

Further, the transistors included in the element portion 401 in FIGS. 8A and 8B and the element portion 701 in FIGS. 9A and 9B can be formed using a crystalline semiconductor layer (a low temperature polysilicon layer) which is obtained by crystallizing an amorphous semiconductor layer at a temperature of 200 to 600° C. (preferably 350 to 500° C.) or a crystalline semiconductor layer (a high temperature polysilicon layer) which is obtained by crystallizing an amorphous semiconductor layer at a temperature higher than or equal to 600° C. Note that in the case where a high temperature polysilicon layer is formed over a substrate, a quartz substrate is preferably used because a glass substrate is weak to heat in some cases.

Hydrogen or a halogen element is preferably added to the semiconductor films (particularly channel regions) of the transistors included in the element portion 401 in FIGS. 8A and 8B and the element portion 701 in FIGS. 9A and 9B at a concentration of $1\times10^{19}$ to $1\times10^{22}$ atoms/cm³, preferably a concentration of $1\times10^{19}$ to $5\times10^{20}$ atoms/cm³. Thus, semiconductor films with few defects, in which cracks are not easily generated, can be obtained.

Further, it is preferable to provide barrier films which block contaminant such as an alkali metal so as to wrap the transistors included in the element portion 401 in FIGS. 8A and 8B and the element portion 701 in FIGS. 9A and 9B or the element portion 401 in FIGS. 8A and 8B and the element portion 701 in FIGS. 9A and 9B themselves. Thus, the element portion 401 in FIGS. 8A and 8B and the element portion 701 in FIGS. 9A and 9B which are not contaminated and have higher reliability can be provided. Note that a silicon nitride film, a silicon nitride oxide film, a silicon oxynitride film, or the like can be used as the barrier film. Further, the thickness of each of the semiconductor films of the transistors included in the element portion 401 in FIGS. 8A and 8B and the element portion 701 in FIGS. 9A and 9B is 20 to 200 nm, preferably 40 to 170 nm, more preferably 45 to 55 nm or 145 to 155 nm, and much more preferably 50 nm or 150 nm. Thus, the element portion 401 in FIGS. 8A and 8B and the element portion 701 in FIGS. 9A and 9B, in which cracks are not easily generated even in the case of being bent, can be provided.

Further, it is preferable that crystals which are included in the semiconductor films of the transistors included in the element portion 401 in FIGS. 8A and 8B and the element portion 701 in FIGS. 9A and 9B be formed so as to have a crystal boundary extending in parallel to a direction where carries flow (a channel length direction). Such semiconductor films are formed using a continuous wave laser, or a pulsed laser which is operated at higher than or equal to 10 MHz, preferably 60 to 100 MHz.

Furthermore, it is preferable that each of the transistors included in the element portion 401 in FIGS. 8A and 8B and the element portion 701 in FIGS. 9A and 9B have characteristics of a subthreshold swing less than or equal to 0.35 V/dec (preferably 0.09 to 0.25 V/dec) and a mobility greater than or equal to 10 cm²/Vs. Such characteristics can be realized when the semiconductor films are formed by using a continuous wave laser or a pulsed laser which is operated at higher than or equal to 10 MHz.

Moreover, each of the transistors included in the element portion 401 in FIGS. 8A and 8B and the element portion 701 in FIGS. 9A and 9B has frequency characteristics higher than or equal to 1 MHz, preferably higher than or equal to 10 MHz (at 3 to 5 V) at the ring oscillator level. Alternatively, each of the transistors included in the element portion 401 in FIGS. 8A and 8B and the element portion 701 in FIGS. 9A and 9B has frequency characteristics higher than or equal to 100 kHz, preferably higher than or equal to 1 MHz (at 3 to 5 V) per gate.

Figure 10A:
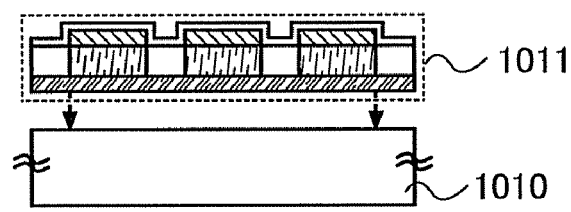
FIGS. 10A and 10B are diagrams illustrating a method for manufacturing a semiconductor device.
Figure 10B:
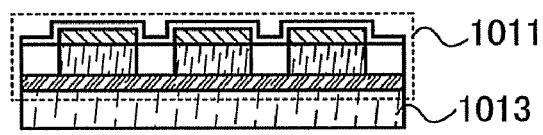

The substrate over which the element portion is formed can be used directly, this embodiment is not limited to this. FIGS. 10A and 10B illustrate an example where a substrate which is different from the substrate over which the element portion is formed is used. FIGS. 10A and 10B are schematic views illustrating a different structure and a different method for manufacturing the semiconductor device in this embodiment.

As illustrated in FIG. 10A, in a substrate 1010 over which an element portion 1011 is formed, the element portion 1011 over the substrate 1010 is separated. Further, as illustrated in FIG. 10B, the separated element portion 1011 can be attached to a substrate 1013 which is different from the substrate 1010. Note that as the substrate 1013, a flexible substrate or the like can be used, for example.

The element portion 1011 can be separated from the substrate 1010 by any of the following methods: a method by which a metal oxide film is provided between the substrate 1010 having high heat resistance and the element portion 1011 and the metal oxide film is crystallized to be weakened so that the element portion 1011 is separated; a method by which an amorphous silicon film containing hydrogen is provided between the substrate 1010 having high heat resistance and the element portion 1011 and the amorphous silicon film is removed by laser irradiation or etching so that the element portion 1011 is separated; a method by which the substrate 1010 having high heat resistance, over which the element portion 1011 is formed, is removed mechanically or by etching with a solution or a gas such as $CF_3$ so that the element portion 1011 is separated; and the like.

Alternatively, instead of the above methods, a metal film (formed using tungsten, molybdenum, titanium, tantalum, or cobalt, for example), a metal oxide film (formed using tungsten oxide, molybdenum oxide, titanium oxide, tantalum oxide, cobalt oxide, for example), or a layered structure of a metal film and a metal oxide film, which functions as a separation layer, is provided between the substrate 1010 and the element portion 1011, and the element portion 1011 can be separated from the substrate 1010 by using a physical means. Alternatively, after an opening portion is selectively formed so that the separation layer is exposed, part of the separation layer is removed with an etching agent such as halogen fluoride (e.g., $ClF_3$), and then, the element portion 1011 can be separated from the substrate 1010 physically.

Further, the separated element portion 1011 may be attached to the substrate 1013 by using a commercialized adhesive, for example, an adhesive such as an epoxy resin-based adhesive or a resin additive.

Figure 10C:
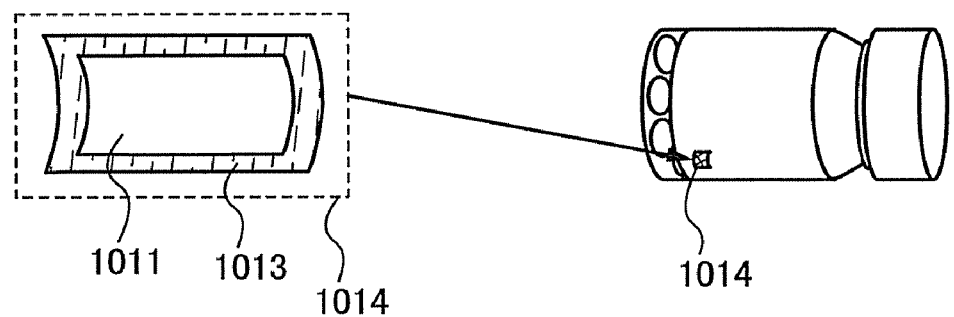
FIG. 10C is a diagrams illustrating usage example of a semiconductor device.

When the element portion 1011 is attached to the substrate 1013 so that the semiconductor device is manufactured as described above, a semiconductor device which is thin, lightweight, and is not easily broken even when it is dropped can be provided. Further, since a flexible substrate is used as the substrate 1013, the substrate 1013 can be attached to a curved surface or an irregular shape and a variety of applications are realized. For example, as illustrated in FIG. 10C, a semiconductor device 1014 of the present invention can be tightly attached to a curved surface of a medicine bottle, for example. Moreover, when the substrate 1010 is reused, a semiconductor device can be provided at lower cost.

Note that this embodiment can be combined with any of the other embodiments as appropriate.

Embodiment 9

In this embodiment, a method for manufacturing a flexible semiconductor device on which a semiconductor memory device according to one embodiment of the present invention can be mounted is described with reference to drawings.

A method for manufacturing a semiconductor device in this embodiment is described with reference to FIGS. 11A to 11C. Here, FIGS. 11A to 11C are diagrams illustrating the structure of the semiconductor device in this embodiment.

Figure 11A:
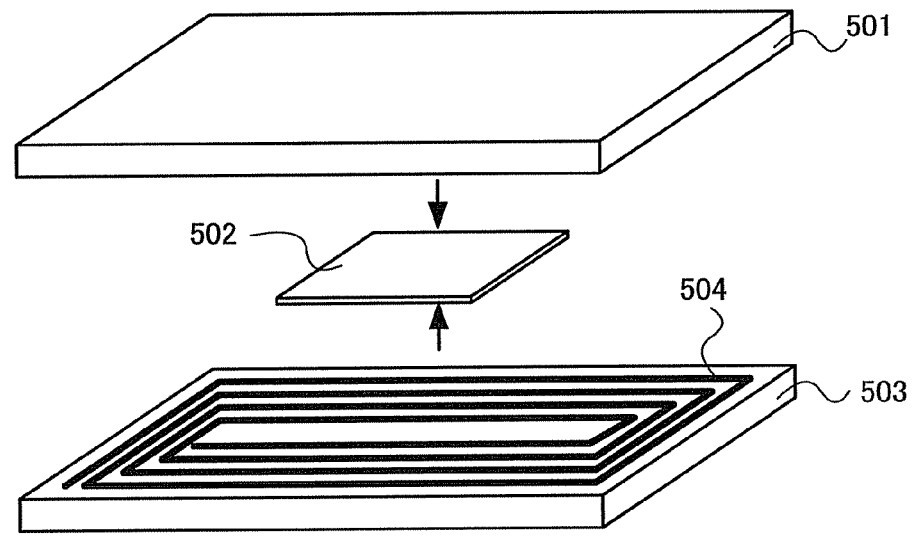
FIGS. 11A and 11C are schematic views illustrating a structure of a semiconductor device.

As illustrated in FIG. 11A, the semiconductor device in this embodiment includes a flexible protective layer 501, a flexible protective layer 503 having an antenna 504, and an element portion 502 which is formed through a separation process. The antenna 504 which is formed over the protective layer 503 is electrically connected to the element portion 502. Although the antenna 504 is formed only over the protective layer 503 in the illustrated structure, the present invention is not limited to this structure. The antenna 504 can also be provided for the protective layer 501. In addition, by forming a barrier film formed using a silicon nitride film or the like between the element portion 502, and the protective layers 501 and 503, a semiconductor device having higher reliability can be provided without contamination of the element portion 502.

For a conductive film which functions as the antenna 504, any of the materials described in Embodiment 4 can be used. Note that although the element portion 502 and the antenna 504 are connected to each other by UV treatment or ultrasonic cleaning with an anisotropic conductive film, the connection method is not limited to this method. The element portion 502 and the antenna 504 can be connected to each other by a variety of methods.

Figure 11B:
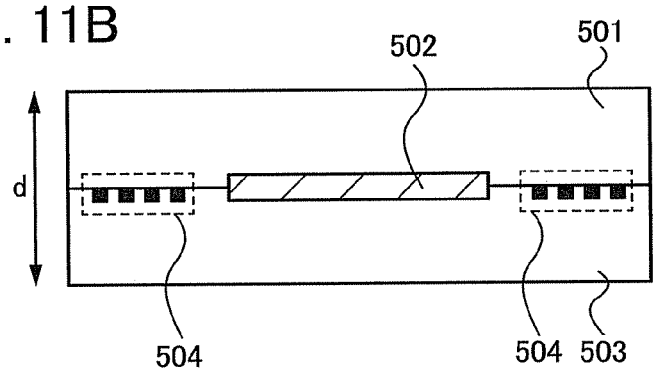
FIG. 11B is a cross-sectional view illustrating the structure of the semiconductor device.
Figure 11C:
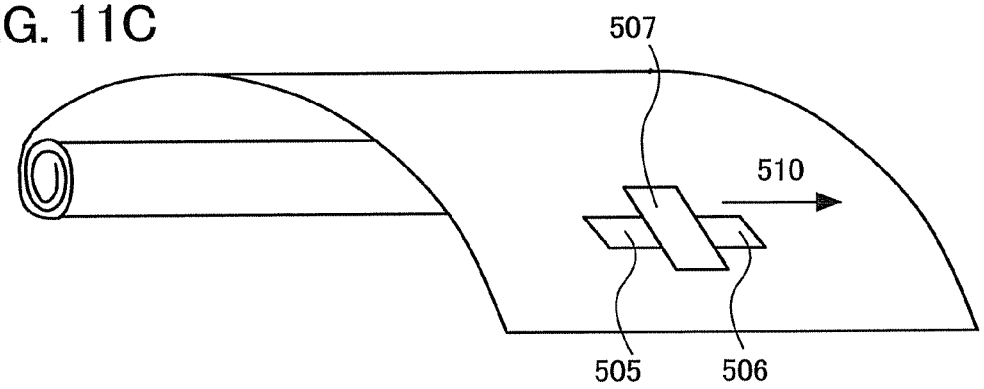

As illustrated in FIG. 11B, the thickness of the element portion 502 which is interposed between the protective layers 501 and 503 is preferably less than or equal to 5 μm, more preferably 0.1 to 3 μm. In addition, when the thickness of the protective layers 501 and 503 which are superposed is denoted by d, the thickness of the protective layers 501 and 503 is preferably (d/2)±30 μm, more preferably (d/2)±10 μm. Further, the thickness of the protective layers 501 and 503 is preferably 10 to 200 μm. Furthermore, the area of the element portion 502 is less than or equal to 5 mm×5 mm (25 mm$^2$), preferably 0.3 mm×0.3 mm (0.09 mm$^2$) to 4 mm×4 mm (16 mm$^2$).

Since the protective layers 501 and 503 are formed using an organic resin material, the protective layers 501 and 503 has high resistance against bending. Further, the element portion 502 itself which is formed through the separation process has higher resistance against bending as compared to a single crystal semiconductor. Since the element portion 502 can be tightly attached to the protective layers 501 and 503 without any space therebetween, a completed semiconductor device itself has high resistance against bending. The element portion 502 which is surrounded by the protective layers 501 and 503 may be provided over a surface of or inside another object, or may be embedded in paper.

Next, the case where the element portion which is formed through the separation process is attached to a substrate having a curved surface is described.

As illustrated in FIG. 1 IC, one transistor in the element portion formed through the separation process includes a drain electrode 505, a source electrode 506, and a gate electrode 507. In addition, the direction 510 where current flows and a direction where a substrate draws an arc are arranged to be perpendicular to each other. With such arrangement, even when the substrate is bent to draw an arc, the influence of stress on the substrate is small, and variations in characteristics of transistors included in the element portion can be suppressed.

Further, when the ratio of the area of an active region (a silicon island portion) of an active element such as a transistor to the whole area of the substrate is 1 to 50% (preferably 1 to 30%), the element can be prevented from being damaged due to stress.

In a region where an active element is not provided, a base insulating material, an interlayer insulating film material, and a wiring material are mainly provided. The ratio of the area of other than the active region such as a transistor to the whole area of the substrate is preferably higher than or equal to 60%. Thus, a semiconductor device which can be easily bent and has a high integration degree can be provided.

By using the method for manufacturing the semiconductor device in this embodiment as described above, the semiconductor device can be manufactured even over a curved surface, and the application range of the semiconductor device can be made wider.

Note that this embodiment can be combined with any of other embodiments as appropriate.

Embodiment 10

In this embodiment, usage examples of a semiconductor device on which a semiconductor memory device according to one embodiment of the present invention is mounted are described.

Usage examples of a semiconductor device on which a semiconductor memory device in this embodiment is mounted are described with reference to FIGS. 12A to 12F. Here, FIGS. 12A to 12F are schematic views illustrating usage examples of a semiconductor device in this embodiment.

Figure 12A:
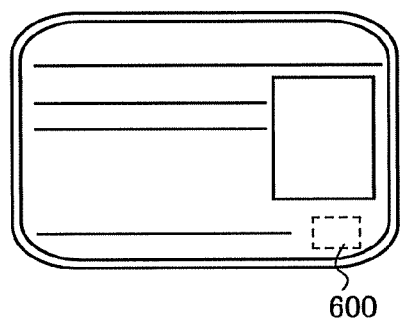
FIGS. 12A to 12F are diagrams illustrating usage examples of a semiconductor device.
Figure 12B:
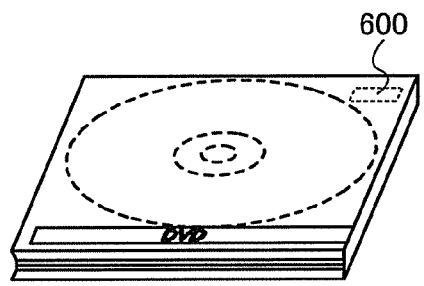
Figure 12C:
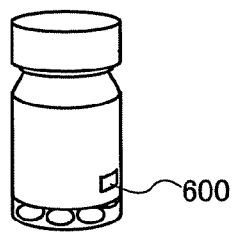
Figure 12D:
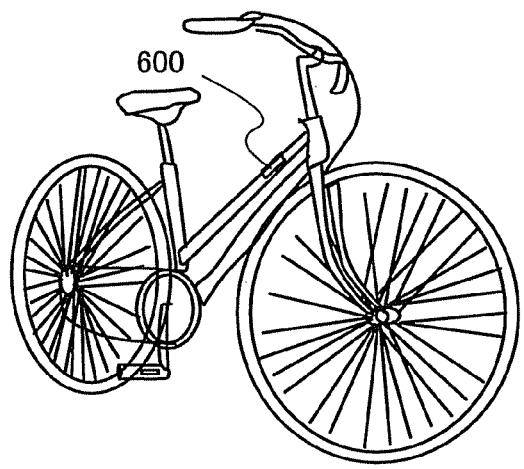
Figure 12E:
Figure 12F:
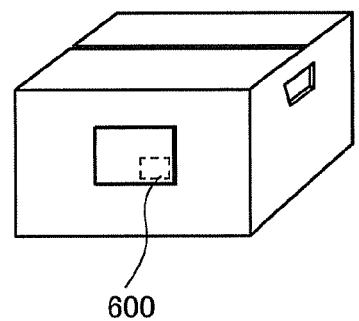

As illustrated in FIGS. 12A to 12F, the semiconductor device can be used widely and can be used by being provided for, for example, bills, coins, securities, bearer bonds, certificates (e.g., driver's licenses or resident cards, see FIG. 12A), containers for wrapping objects (e.g., wrapping paper or bottles, see FIG. 12C), recording media (e.g., DVDs or video tapes, see FIG. 12B), vehicles (e.g., bicycles, see FIG. 12D), personal belongings (e.g., bags or glasses), foods, plants, animals, human bodies, clothes, commodities, or electronic devices (e.g., liquid crystal display devices, EL display devices, television sets, or mobile phones), or shipping tags of objects (see FIGS. 12E and 12F).

A semiconductor device 600 is fixed to an object by being mounted on a printed board, attached to a surface, or embedded therein. For example, the semiconductor device is fixed to an object by being embedded in paper of a book or an organic resin of a package. Since the semiconductor device 600 achieves reduction in size, thickness, and weight, the attractive design of the object itself is not spoiled even after the semiconductor device is fixed to the object. In addition, when the semiconductor device 600 is provided for bills, coins, securities, bearer bonds, certificates, or the like, an authentication function can be provided, and forgery thereof can be prevented by utilizing the authentication function. Further, when the semiconductor device of the present invention is attached to containers for wrapping objects, recording media, personal belongings, foods, clothes, commodities, electronic devices, or the like, a system such as an inspection system can be efficiently used. Furthermore, even vehicles can have higher safety against theft or the like when the semiconductor device of the present invention is attached to the vehicles.

When the semiconductor device on which the semiconductor memory device according to one embodiment of the present invention is mounted is used for each usage described in this embodiment in this manner, data which is used for exchanging information can be maintained at an accurate value. Therefore, reliability of authenticity or security of an object can be increased.

Embodiment 11

In this embodiment, a method for manufacturing a semiconductor device including an anti-fuse semiconductor memory device is described with reference to FIGS. 15A to 15E, FIGS. 16A to 16E, FIGS. 17A to 17E, FIGS. 18A to 18D, and FIGS. 19A to 19D.

In this embodiment, a method for manufacturing a semiconductor device where a logic circuit portion 1550, a semiconductor memory circuit portion 1552, and an antenna portion 1554 are provided over the same substrate is described. Circuits including thin film transistors are integrated in the logic circuit portion 1550. In the semiconductor memory circuit portion 1552, a memory cell includes a plurality of transistors and an anti-fuse memory element. Note that for convenience, FIG. 15E, FIGS. 16A to 16E, FIGS. 17A to 17E, FIGS. 18A to 18D, and FIGS. 19A to 19D are cross-sectional views each illustrating two thin film transistors which are included in the logic circuit portion 1550, one thin film transistor and one memory element which are included in the semiconductor memory circuit portion 1552, and one capacitor and one thin film transistor which are included in the antenna portion 1554. Note that each element illustrated in the cross-sectional views in this embodiment is illustrated with an exaggerated scale in order to describe the structures definitely.

Note that in this embodiment, a semiconductor device refers to all devices that can function by utilizing semiconductor characteristics.

First, a metal layer 1502 which serves as a separation layer is formed over a base substrate 1501.

In this embodiment, a glass substrate is used as the base substrate 1501, and a 30-nm-thick tungsten layer is used as the metal layer 1502 (FIG. 15A).

Next, a first insulating film 1503 is formed over the metal layer 1502. In this embodiment, a layer in which 50-nm-thick silicon nitride oxide film and 100-nm-thick silicon oxynitride film are stacked is used as the first insulating film (FIG. 15B).

Next, a semiconductor layer 1570 is formed over the first insulating film 1503. In this embodiment, 66-nm-thick amorphous silicon film is formed over the first insulating film 1503 and is crystallized by laser irradiation so as to be used as the semiconductor layer 1570 (FIG. 15C).

Note that if necessary, a slight amount of an impurity element (boron or phosphorus) may be added to the semiconductor layer 1570 in order to control the threshold voltage of a thin film transistor to be completed later. In this embodiment, boron is added to the semiconductor layer 1570 by an ion doping method by which diborane ($B_2H_6$) is not mass-separated but excited by plasma (FIG. 15D).

Next, the semiconductor layer 1570 is selectively etched so that semiconductor layers 1571 to 1576 having desired shapes are formed (FIG. 15E).

In addition, in order to form a channel region, an impurity element may be added to semiconductor layers including regions which serve as n-channel transistors at a low concentration. In this embodiment, boron is added to the semiconductor layers 1572 to 1576 including the regions which serve as the n-channel transistors with a semiconductor layer 1571 formed in a region which serves as a p-channel transistor covered with a resist mask 1577 (FIG. 16A).

Next, a second insulating film 1578 which covers the semiconductor layers 1571 to 1576 is formed. In this embodiment, 10-nm-thick silicon oxynitride is used for the second insulating film 1578 (FIG. 16B).

Next, in order to make the semiconductor layers 1574 and 1575 formed in regions which serve as capacitors later function as conductors, an impurity element (boron or phosphorus) is added to the semiconductor layers at a high concentration. In this case, an impurity element which imparts p-type conductivity is preferably added to a region which is used as a first assist capacitor in a memory cell. Note that the semiconductor layers 1571, 1572, 1573, and 1576 formed in regions which serve as the transistors may be covered with resist masks 1579 to 1581 (FIG. 16C).

Next, gate electrodes 1504 to 1507, a capacitor electrode 1508, and a first electrode 1509 which serves as a lower electrode of a memory element are formed over the second insulating film 1578.

Since the first electrode 1509 is used as an anti-fuse electrode which is in contact with amorphous silicon, a material which reacts with silicon is preferably used. In this embodiment, as the gate electrodes 1504 to 1507, the capacitor electrode 1508, and the first electrode 1509, 30-nm-thick tantalum nitride film and 370-nm-thick tungsten film are stacked is used (FIG. 16D).

Next, resist masks 1582 to 1584 are formed so as to cover the semiconductor layer 1571 formed in the region which serves as the p-channel transistor and the semiconductor layers 1574 and 1575 formed in the regions which serve as the capacitors. After that, an impurity element is added to the semiconductor layers 1572, 1573, and 1576 formed in the regions which serve as the n-channel transistors by using the gate electrodes 1505 to 1507 as masks, so that impurity regions are formed. In this embodiment, phosphorus (P) is added to the semiconductor layers 1572, 1573, and 1576 formed in the regions which serve as the n-channel transistors so as to be contained at a concentration of $1\times10^{15}$ to $1\times10^{19}/cm^3$, so that n-type impurity regions are formed (FIG. 16E).

Next, resist masks 1585 to 1587 are formed so as to cover the semiconductor layers 1572, 1573, and 1576 formed in the regions which serve as the n-channel transistors. After that, an impurity element is added to the semiconductor layer 1571 formed in the region which serves as the p-channel transistor by using the gate electrode 1504 as a mask, so that p-type impurity regions are formed. At the same time, an impurity element is added to the semiconductor layers 1574 and 1575 formed in the regions which serve as the capacitors, so that p-type impurity regions are formed. In this embodiment, boron (B) is added to the semiconductor layer 1571 formed in the region which serves as the p-channel transistor and the semiconductor layers 1574 and 1575 formed in the regions which serve as the capacitors so as to be contained at a concentration of $1\times10^{19}$ to $1\times10^{20}/cm^3$, so that the p-type impurity regions are formed. Accordingly, a channel formation region 1516 and a pair of p-type impurity regions 1514 are formed in a self-aligning manner in the semiconductor layer 1571 formed in the region which serves as the p-channel transistor. The p-type impurity regions 1514 function as a source region and a drain region of the p-channel transistor. In a similar manner, p-type impurity regions 1515 and 1517 having different concentrations of impurities are formed in a self-aligning manner in the semiconductor layers 1574 and 1575 which serve as the capacitors (FIG. 17A).

Next, a third insulating film 1588 is formed so as to cover the second insulating film 1578, the gate electrodes 1504 to 1507, the capacitor electrode 1508, and the first electrode 1509. In this embodiment, as the third insulating film 1588, a layered structure of 100-nm-thick silicon oxynitride film and 200-nm-thick ITO film is used (FIG. 17B). Then, the third insulating film 1588 is selectively etched, so that sidewall insulating films 1510 and sidewall insulating films 1511 which are in contact with side surfaces of the gate electrodes 1504 to 1507, the capacitor electrode 1508, and the first electrode 1509 are formed. Note that part of the second insulating film 1578 is etched away at the same time as the formation of the sidewall insulating films 1510. The part of the second insulating film 1578 is removed, so that gate insulating films 1512 are formed below the gate electrodes 1504 to 1507 and the sidewall insulating films 1510. Further, the part of the second insulating film 1578 is removed, so that insulating films 1513 remain below the capacitor electrode 1508, the first electrode 1509, and the sidewall insulating films 1511 (FIG. 17C).

Next, resist masks 1589 to 1591 are formed so as to cover the semiconductor layer 1571 formed in the region which serves as the p-channel transistor and the semiconductor layers 1574 and 1575 formed in the regions which serve as the capacitors. After that, an impurity element is added to the semiconductor layers 1572, 1573, and 1576 formed in the regions which serve as the n-channel transistors by using the gate electrodes 1505 to 1507 and the sidewall insulating films 1510 as masks, so that high-concentration impurity regions are formed. In this embodiment, phosphorus (P) is added to the semiconductor layers 1572, 1573, and 1576 formed in the regions which serve as the n-channel transistors so as to be contained at a concentration of $1 \times 10^{19}$ to $1 \times 10^{20}/cm^3$, so that n-type high-concentration impurity regions and n-type impurity regions are formed. Accordingly, channel formation regions 1520, a pair of low-concentration impurity regions 1519 which serves as LDD, and a pair of high-concentration impurity regions 1518 which serve as source regions and drain regions are formed in the semiconductor layers 1572, 1573, and 1576 formed in the regions which serve as the n-channel transistors in a self-aligning manner. Note that the low-concentration impurity regions 1519 which serves as the LDD regions are formed below the sidewall insulating films 1510 (FIG. 17D).

Note that here although the structure is described in which the LDD regions are formed in the semiconductor layers 1572, 1573, and 1576 formed in the regions which serve as the n-channel transistors and LDD regions are not formed in the semiconductor layer 1571 formed in the region which serves as the p-channel transistor, the structure is not limited to this as a matter of course. The LDD regions may be formed in the semiconductor layers included in both the n-channel transistors and the semiconductor layer included in the p-channel transistor. In particular, in the case where the gate insulating film (the GI film) is thin, specifically, in the case where the thickness of the gate insulating film is 10 nm or less, LDD structures are preferably used in order to improve withstand voltage of the p-channel transistor.

Next, a fourth insulating film 1522 containing hydrogen is formed so as to cover the semiconductor layers 1571 to 1576, the gate electrodes 1504 to 1507, the capacitor electrode 1508, and the first electrode 1509. In this embodiment, 50-nm-thick silicon oxynitride film is used as the fourth insulating film 1522 (FIG. 17E).

Figure 18A:
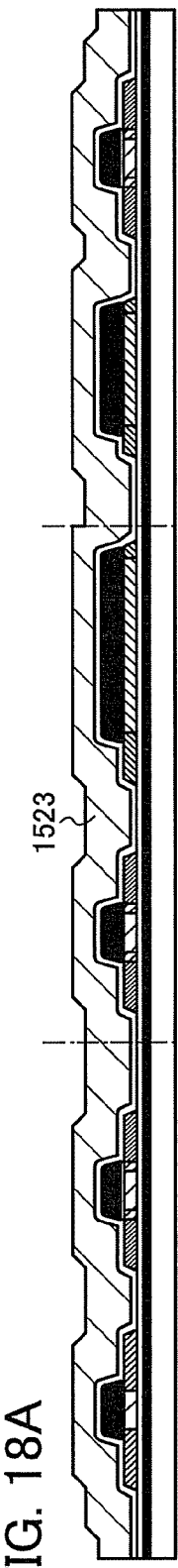
FIGS. 18A to 18D are cross-sectional views illustrating the method for manufacturing a semiconductor device.

Then, a fifth insulating film 1523 is formed so as to cover the fourth insulating film 1522. In this embodiment, a film in which 100-nm-thick silicon nitride oxide film and 600-nm-thick silicon oxynitride film are stacked is used as the fifth insulating film (FIG. 18A).

Figure 18B:
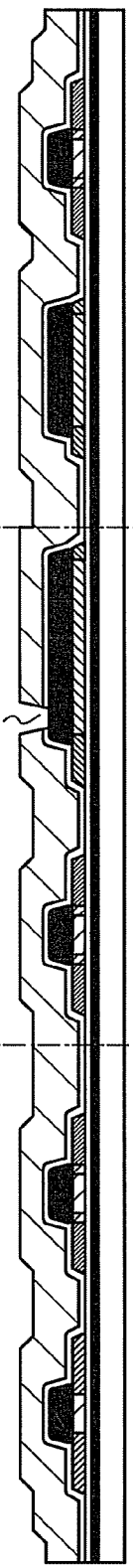

Next, the fourth insulating film 1522 and the fifth insulating film 1523 are selectively etched, so that a first opening 1521 which reaches the first electrode 1509 is formed. In this embodiment, the diameter of the first opening 1521 is 2 μm (FIG. 18B).

Figure 18C:
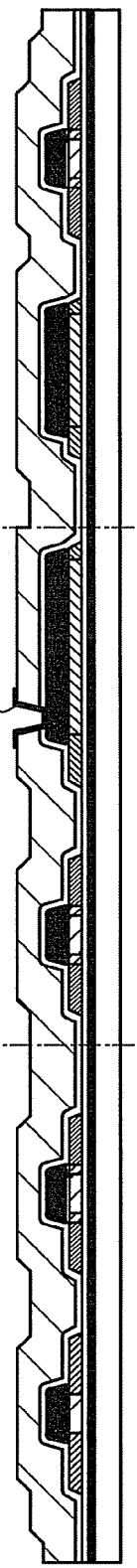

Next, a semiconductor layer 1524 used as a memory element is formed. In this embodiment, as the semiconductor layer 1524, a film in which a 15-nm-thick amorphous silicon layer and a 6-nm-thick silicon oxynitride layer are sequentially stacked by plasma-enhanced CVD is used (FIG. 18C).

Figure 18D:
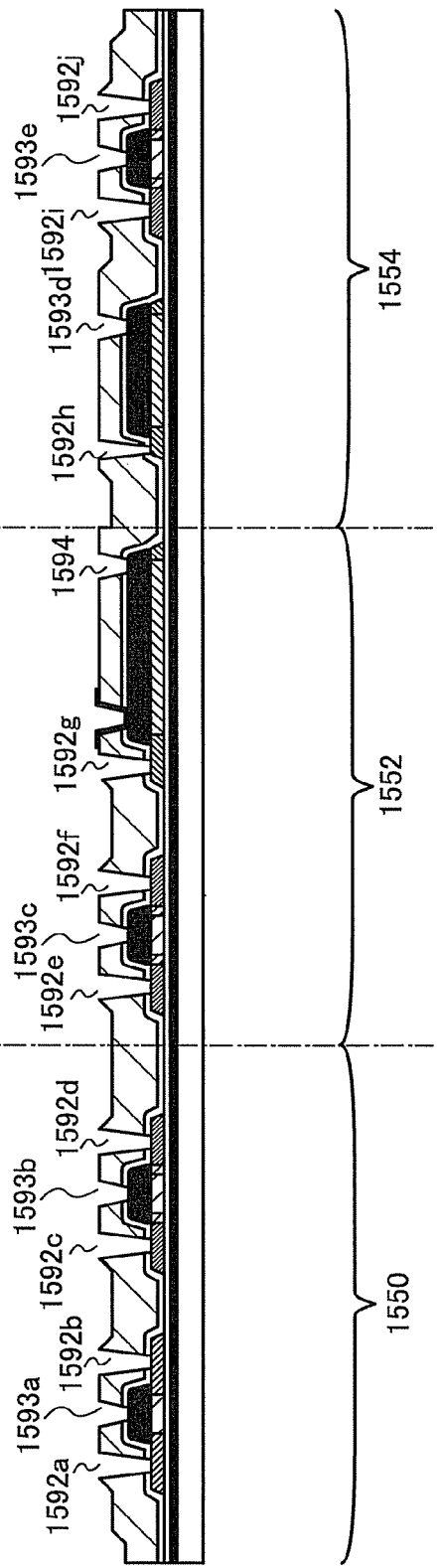

Next, the fourth insulating film 1522 and the fifth insulating film 1523 are selectively etched, so that contact holes 1592*a* to 1592*j* which reach the semiconductor layers 1571 to 1576, contact holes 1593*a* to 1593*e* which reach the gate electrodes 1504 to 1507 and the capacitor electrode 1508, and a second opening 1594 which reaches the first electrode 1509 are formed (FIG. 18D).

After that, oxide films formed on exposed surfaces of the semiconductor layers 1571 to 1576, surfaces of the gate electrodes 1504 to 1507, a surface of the capacitor electrode 1508, and an exposed surface of the first electrode 1509 are removed with an etchant containing hydrofluoric acid, and at the same time, the surfaces are cleaned.

Next, a conductive film which covers the fifth insulating film 1523, the semiconductor layer 1524, the contact holes 1592*a* to 1592*j*, the contact holes 1593*a* to 1593*e*, and the second opening 1594 is formed (not illustrated). In this embodiment, a three-layer structure of a 100-nm-thick titanium layer, a 300-nm-thick pure aluminum layer, and a 100-nm-thick titanium layer is used as the conductive film.

Next, the conductive film is selectively etched, so that conductive films 1525, 1526, 1527, 1528, 1531, and 1532 which function as source electrodes and drain electrodes, a wiring 1529 which serves as a bit line of a selection transistor, a wiring 1530 which serves as a word line, wirings 1535, 1536, and 1537 which serve as gate leading wirings, a second electrode 1540 and a third electrode 1541 of the semiconductor memory circuit portion, wirings 1533 and 1534 which serve as electrodes of a capacitor in the antenna portion, and a fourth electrode 1542 in the antenna portion are formed. The second electrode 1540 overlaps with the first opening 1521 and serves as the upper electrode of the memory element. In addition, the second electrode 1540 is electrically connected to the semiconductor layer 1574 which serves as one of electrodes of the first assist capacitor. Further, the third electrode 1541 overlaps with a second opening 1594 and is electrically connected to the first electrode 1509. Note that although not illustrated here, the third electrode 1541 is electrically connected to a cathode, and the fourth electrode 1542 is electrically connected to a thin film transistor in the antenna portion (FIG. 19A).

Next, a sixth insulating film 1543 and a seventh insulating film 1544 which cover a thin film transistor in the logic circuit portion 1550, a thin film transistor and a memory element in the semiconductor memory circuit portion 1552, and the thin film transistor in the antenna portion 1554 are formed. In this embodiment, 50-nm-thick silicon nitride ($Si_3N_4$) is used for the sixth insulating film 1543, and 1500-nm-thick polyimide film is used for the seventh insulating film 1544.

Subsequently, the seventh insulating film 1544 is selectively etched, so that a third opening 1595 which reaches the sixth insulating film 1543 is formed. Further, the sixth insulating film 1543 and the seventh insulating film 1544 are selectively etched, so that a fourth opening 1596 which reaches the fourth electrode 1542, fifth openings 1597 which reach the conductive film 1525 and the conductive film 1528, and a sixth opening 1598 which reaches the second electrode 1540 are formed (FIG. 19B).

Next, a conductive film (not illustrated) is formed over the seventh insulating film 1544. In this embodiment, a three-layer structure of a 100-nm-thick titanium layer, a 200-nm-thick pure aluminum layer, and a 100-nm-thick titanium layer is used as the conductive film.

Subsequently, the conductive film is selectively etched, so that a fifth electrode 1545 which serves as the upper electrode of the second assist capacitor, a sixth electrode 1546 which is used as the wiring electrode of the logic circuit portion, and a seventh electrode 1547 in the antenna portion are formed. The fifth electrode 1545 is electrically connected to the second electrode 1540 (FIG. 19C).

An eighth insulating film 1548 is formed so as to cover the seventh insulating film 1544, the fifth electrode 1545, the sixth electrode 1546, and the seventh electrode 1547.

Subsequently, the eighth insulating film 1548 is selectively etched, so that a seventh opening which reaches the seventh electrode 1547 is formed.

Subsequently, a base layer 1549 of an antenna is formed.

Subsequently, an antenna 1599 is formed over the base layer 1549 of the antenna (FIG. 19D).

In this embodiment, the thin film transistor in the logic circuit portion 1550, the thin film transistor and the memory element in the semiconductor memory circuit portion 1552, and the thin film transistor and the antenna in the antenna portion 1554 can be formed over the same substrate.

After that, the metal layer 1502 and the base substrate 1501 are removed by separation.

After that, one sheet over which a plurality of semiconductor devices are formed is cut into separate semiconductor devices by a cutter, dicing, or the like. By using a method by which each semiconductor device is picked up and separated, this cutting step is not needed.

Next, the semiconductor device is fixed to a sheet-like substrate. For the sheet-like substrate, plastics, paper, a prepreg, a ceramic sheet, or the like can be used. The semiconductor device may be fixed so as to be interposed between two sheet-like substrates, or the semiconductor device may be fixed to one sheet-like substrate with an adhesive layer. For the adhesive layer, any of a variety of curable adhesives, such as a reactive curable adhesive; a thermosetting adhesive; a photo curable adhesive such as an ultraviolet curable adhesive; and an anaerobic adhesive can be used. Alternatively, the semiconductor device can be provided in the middle of making paper, so that the semiconductor device can be provided inside one piece of paper.

In this embodiment, the thin film transistor in the logic circuit portion 1550, a thin film transistor 1557 which serves as a selection transistor in the semiconductor memory circuit portion 1552, a first assist capacitor 1558, a second assist capacitor 1559, a memory element 1560, and the thin film transistor in the antenna portion 1554 can be formed over the same substrate. In addition, the first assist capacitor 1558 and the second assist capacitor 1559 are connected between the electrode 1540 and the electrode 1541 with the memory element 1560 interposed therebetween so that the first assist capacitor 1558 and the second assist capacitor 1559 are provided in parallel with the memory element 1560. Here, cross-sectional views of a p-channel transistor and an n-channel transistor provided in the logic circuit portion 1550, the thin film transistor 1557 provided in the semiconductor memory circuit portion 1552, the first assist capacitor 1558, the second assist capacitor 1559, the memory element 1560, and a capacitor and an n-channel transistor provided in the antenna portion 1554 are illustrated. Note that the present invention is not particularly limited to this, and the thin film transistor provided in the semiconductor memory circuit portion 1552 may be a p-channel transistor. Further, a p-channel transistor may be provided in the antenna portion 1554. Here, one n-channel transistor is illustrated for convenience.

A memory of the semiconductor device formed through the above steps includes a semiconductor memory device according to one embodiment of the present invention. In the semiconductor memory device according to one embodiment of the present invention, the area is reduced by stacking the second assist capacitor 1559 formed using the third electrode 1541, the sixth insulating film 1543, and the fifth electrode 1545 over the first assist capacitor 1558. In addition, a capacitor provided inside a DC-DC converter can be formed by the same method as a method for forming the first assist capacitor 1558 and the second assist capacitor 1559. By using a semiconductor device including the semiconductor memory device according to the present invention, reduction in size can be achieved. Further, by forming the logic circuit portion 1550, the semiconductor memory circuit portion 1552, and the antenna portion 1554 over the same substrate, malfunctions in writing or reading data can be reduced.

Embodiment 12

Figure 13B:
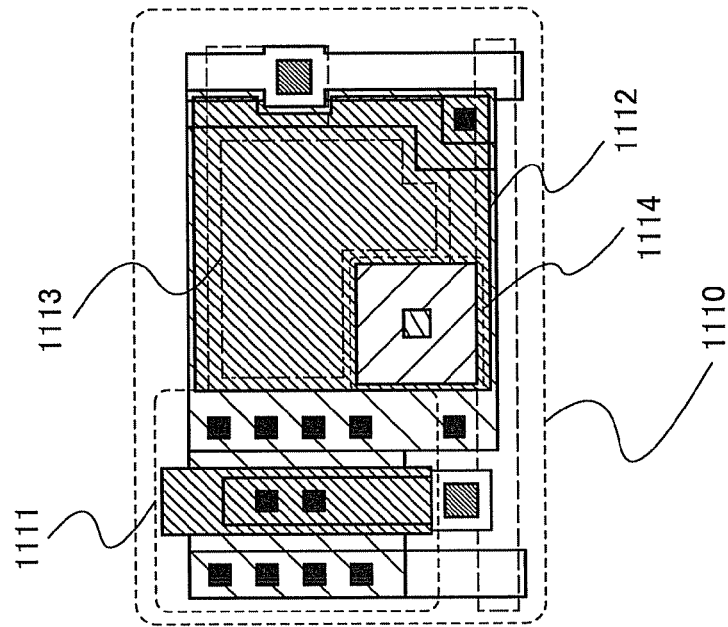
FIGS. 13A and 13B are diagrams for comparing a semiconductor memory device with a conventional semiconductor memory device.

In this embodiment, size comparison between a memory cell to which one embodiment of the present invention is applied and a memory cell to which the present invention is not applied is described with reference to FIGS. 13A and 13B.

Figure 13A:
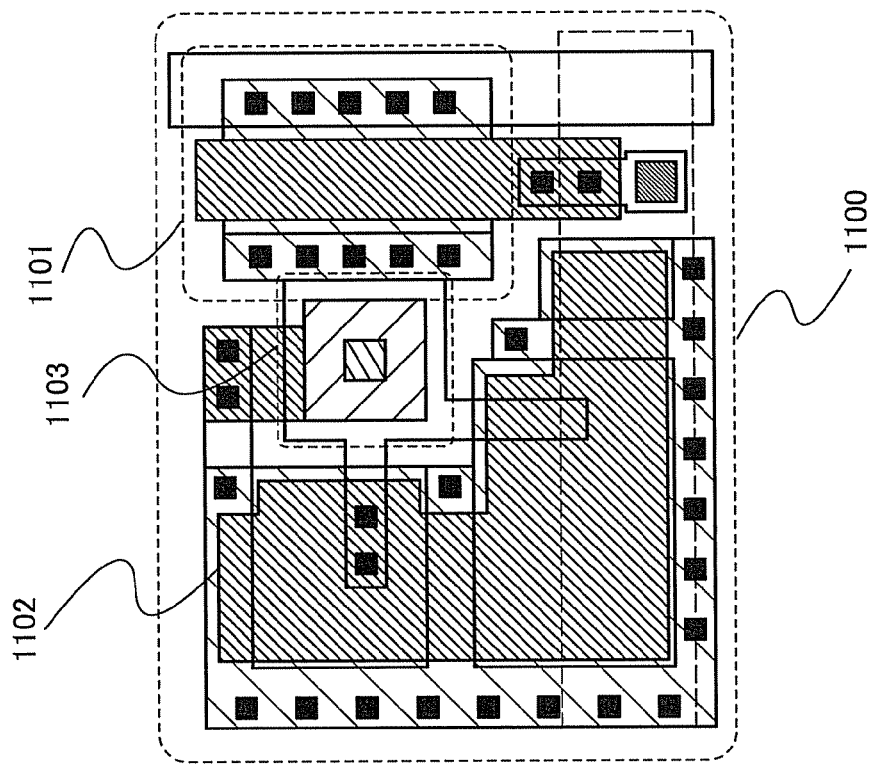

FIG. 13A illustrates a memory cell 1100 to which the present invention is not applied. Further, FIG. 13B illustrates a memory cell 1110 to which one embodiment of the present invention is applied.

Here, the memory cell 1100 includes a selection transistor 1101, an assist capacitor 1102, and a memory element 1103. In addition, the memory cell 1110 includes a selection transistor 1111, a first assist capacitor 1112, a second assist capacitor 1113, and a memory element 1114.

The memory cell 1100 and the memory cell 1110 each include an assist capacitor of 1 pF. However, in the memory cell 1110 in which the second assist capacitor 1113 is provided, the ratio of the area of the assist capacitors with respect to the whole area of the memory cell is decreased by about 30% as compared to the memory cell 1100.

Further, in the memory cell 1110, when the size of the selection transistor 1111 is reduced and the memory element 1114 is provided over the first assist capacitor 1112, the size of the memory cell 1110 is 25 μm×40 μm. On the other hand, the size of the memory cell 1100 is 40.5 μm×50.5 μm. That is, the whole area of the memory cell in the memory cell 1110 is decreased by about 50% as compared to the memory cell 1100.

Further, change in whole area of a memory circuit (including a memory cell, a decoder, an interface, and a DC-DC converter) by using the memory cell 1110 is considered.

The whole size of a memory circuit including a memory capacitor of 1 Kbit is 2.45 mm×2.7 mm. Therefore, in the case where the memory cell 1100 is used, the ratio of the area of the memory cell with respect to the whole area of the memory circuit is about 36%.

On the other hand, since the area of the memory cell 1110 is about half the area of the memory cell 1100; therefore, in the case where the memory cell 1110 is used, the ratio of the area of the memory cell with respect to the whole area of the memory circuit can be reduced by about 18% as compared to the case where the memory cell 1100 is used.

Further, trial calculation in the case where the number of bits of the memory cell is increased is performed. If memory capacity is 4 Kbit, in the case where the memory cell 1110 is used, the whole area of the memory circuit can be reduced by about 28% as compared to the case where the memory cell 1100 is used. Alternatively, if the memory capacity is 16 Kbit, in the case where the memory cell 1110 is used, the whole area of the memory circuit can be reduced by about 37% as compared to the case where the memory cell 1100 is used.

This application is based on Japanese Patent Application serial no. 2008-252326 filed with Japan Patent Office on Sep. 30, 2008, the entire contents of which are hereby incorporated by reference.

EXPLANATION OF REFERENCE

100: memory cell, 101: selection transistor, 102: assist capacitor, 103: assist capacitor, 104: memory element, 105: electrode, 106: electrode, 107: electrode, 108: semiconductor film, 109: electrode, 110: electrode, 111: electrode, 112: semiconductor film, 113: insulating film, 114: insulating film, 115: insulating film, 116: insulating film, 200: memory cell, 201: assist capacitor, 202: electrode, 203: electrode, 204: electrode, 205: electrode, 206: insulating film, 207: insulating film, 250: memory cell, 251: assist capacitor, 252: insulating film, 300: semiconductor device, 301: RF circuit, 302: clock generation circuit, 303: logic circuit, 304: power supply circuit, 305: demodulation circuit, 306: modulation circuit, 307: frequency divider circuit, 309: counter circuit, 310: CPU, 311: ROM, 312: RAM, 313: controller, 314: CPU interface, 315: RF interface, 316: memory controller, 317: antenna, 318: antenna portion, 319: reference clock generation circuit, 400: substrate, 401: element portion, 402: antenna, 403: interlayer film, 404: element, 405: conductive film, 406: conductive film, 501: protective layer, 502: element portion, 503: protective layer, 504: antenna, 505: drain electrode, 506: source electrode, 507: gate electrode, 510: direction, 600: semiconductor device, 700: substrate, 701: element portion, 702: antenna, 703: substrate, 704: element, 706: conductive film, 708: conductive layer, 709: resin, 711: conductive film, 800: memory cell, 801: selection transistor, 802: assist capacitor, 803: assist capacitor, 804: memory element, 805: semiconductor film, 806: electrode, 807: electrode, 808: electrode, 809: electrode, 810: electrode, 811: electrode, 812: electrode, 813: electrode, 814: semiconductor film, 815: contact hole, 816: contact hole, 817: contact hole, 818: contact hole, 819: contact hole, 820: contact hole, 821: contact hole, 822: insulating film, 823: insulating film, 900: capacitor, 901: capacitor, 902: capacitor, 903: electrode, 904: semiconductor film, 905: conductive film, 906: conductive film, 907: conductive film, 908: conductive film, 909: contact hole, 910: contact hole, 911: contact hole, 913: insulating film, 914: insulating film, 1010: substrate, 1011: element portion, 1013: substrate, 1014: semiconductor device, 1100: memory cell, 1101: selection transistor, 1102: assist capacitor, 1103: memory element, 1110: memory cell, 1111: selection transistor, 1112: assist capacitor, 1113: assist capacitor, 1114: memory element, 1201: diode, 1211: middle stage capacitor, 1220: last stage capacitor, 1221: inverter, 1501: base substrate, 1502: metal layer, 1503: first insulating film, 1504: gate electrode, 1505: gate electrode, 1506: gate electrode, 1507: gate electrode, 1508: capacitor electrode, 1509: first electrode, 1510: sidewall insulating film, 1511: sidewall insulating film, 1512: gate insulating film, 1513: insulating film, 1514: p-type impurity region, 1515: p-type impurity region, 1516: channel formation region, 1518: high-concentration impurity region, 1519: low-concentration impurity region, 1520: channel formation region, 1521: opening, 1522: fourth insulating film, 1523: fifth insulating film, 1524: semiconductor layer, 1525: conductive film, 1528: conductive film, 1529: wiring, 1530: wiring, 1533: wiring, 1534: wiring, 1535: wiring, 1536: wiring, 1537: wiring, 1540: second electrode, 1541: third electrode, 1542: fourth electrode, 1543: sixth insulating film, 1544: seventh insulating film, 1545: fifth electrode, 1546: sixth electrode, 1547: seventh electrode, 1548: eighth insulating film, 1549: base layer, 1550: logic circuit portion, 1552: semiconductor memory circuit portion, 1554: antenna portion, 1557: thin film transistor, 1558: assist capacitor, 1559: assist capacitor, 1560: memory element, 1570-1576: semiconductor layer, 1577: resist mask, 1578: second insulating film, 1579-1581: resist mask, 1582: resist mask, 1583: resist mask, 1584: resist mask, 1585: resist mask, 1586: resist mask, 1587: resist mask, 1588: third insulating film, 1589-1591: resist mask, 1594: second opening, 1595: opening, 1596: opening, 1597: opening, 1598: opening, 1599: antenna, 3000: memory circuit, 3001: memory cell array, 3002: column decoder, 3003: row decoder, 3004: address selector, 3005: selector, 3006: circuit, 3007: DC-DC converter, 1592a-1592j: contact hole, and 1593a-1593e: contact hole

The invention claimed is:

1. A semiconductor device comprising a memory cell, the memory cell comprising:
a transistor including a first semiconductor film, a gate insulating film over the first semiconductor film, a gate electrode over the gate insulating film, a source electrode, and a drain electrode;
a memory element including a first electrode, a second semiconductor film over the first electrode, and a second electrode over the second semiconductor film;
a first capacitor including a third electrode, a first insulating film over the third electrode, and a fourth electrode over the first insulating film; and
a second capacitor over the first capacitor, the second capacitor including a fifth electrode, a second insulating film over the fifth electrode, and a sixth electrode over the second insulating film,
wherein one of the source electrode and the drain electrode is electrically connected to the second electrode, the third electrode, and the fifth electrode,
wherein the first electrode is electrically connected to the fourth electrode and the sixth electrode,
wherein the gate insulating film and the first insulating film are formed by using the same material,
wherein the gate electrode, the first electrode and the fourth electrode are formed by using the same material, and
wherein the source electrode, the drain electrode, the second electrode, and the fifth electrode are formed by using the same material.

2. The semiconductor device according to claim 1, wherein the memory element is formed over the first capacitor.

3. The semiconductor device according to claim 1, wherein the first electrode and the fourth electrode are formed by using the same conductive layer.

4. The semiconductor device according to claim 1, wherein the third electrode is formed by using a third semiconductor film including an impurity, and
wherein the first semiconductor film and the third semiconductor film are formed by using the same material.

5. The semiconductor device according to claim 1, wherein the memory element, the first capacitor, and the second capacitor are connected in parallel.

6. The semiconductor device according to claim 1, wherein the gate insulating film, the first insulating film, and the second insulating film include silicon nitride.

7. The semiconductor device according to claim 1, wherein the second semiconductor film causes silicide reaction with the first electrode when high voltage potential is applied between the first electrode and the second electrode.

8. The semiconductor device according to claim 1, wherein the second insulating film is provided over the transistor.

9. A semiconductor device comprising a memory cell, the memory cell comprising:

a transistor including a first semiconductor film, a gate insulating film over the first semiconductor film, a gate electrode over the gate insulating film, a source electrode, and a drain electrode;

a memory element including a first electrode, a second semiconductor film over the first electrode, and a second electrode over the second semiconductor film;

a first capacitor including a third electrode, a first insulating film over the third electrode, and a fourth electrode over the first insulating film;

a second capacitor over the first capacitor, the second capacitor including a fifth electrode, a second insulating film over the fifth electrode, and a sixth electrode over the second insulating film; and a third capacitor over the second capacitor, the third capacitor including a seventh electrode, a third insulating film over the seventh electrode, and an eighth electrode over the third insulating film, wherein one of the source electrode and the drain electrode is electrically connected to the second electrode, the third electrode, the fifth electrode, and the seventh electrode, wherein the first electrode is electrically connected to the fourth electrode, the sixth electrode, and the eighth electrode, wherein the gate insulating film and the first insulating film are formed by using the same material, wherein the gate electrode, the first electrode and the fourth electrode are formed by using the same material, and wherein the source electrode, the drain electrode, the second electrode, and the fifth electrode are formed by using the same material.

10. The semiconductor device according to claim 9, wherein the memory element is formed over the first capacitor.

11. The semiconductor device according to claim 9, wherein the first electrode and the fourth electrode are formed by using the same conductive layer.

12. The semiconductor device according to claim 9,
wherein the third electrode is formed by using a third semiconductor film including an impurity, and
wherein the first semiconductor film and the third semiconductor film are formed by using the same material.

13. The semiconductor device according to claim 9, wherein the memory element, the first capacitor, the second capacitor, and the third capacitor are connected in parallel.

14. The semiconductor device according to claim 9, wherein the gate insulating film, the first insulating film, the second insulating film, and the third insulating film include silicon nitride.

15. The semiconductor device according to claim 9, wherein the second semiconductor film causes silicide reaction with the first electrode when high voltage potential is applied between the first electrode and the second electrode.

16. The semiconductor device according to claim 9, wherein the second insulating film is provided over the transistor.

* * * * *